(12) United States Patent
Yang

(10) Patent No.: US 7,015,123 B2
(45) Date of Patent: Mar. 21, 2006

(54) AMORPHOUS SILICON CRYSTALLIZATION METHOD

(75) Inventor: Myoung-Su Yang, Gunpo-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 64 days.

(21) Appl. No.: 10/870,074

(22) Filed: Jun. 18, 2004

(65) Prior Publication Data

US 2004/0224487 A1    Nov. 11, 2004

Related U.S. Application Data

(62) Division of application No. 10/157,204, filed on May 30, 2002.

(30) Foreign Application Priority Data

Jun. 7, 2001    (KR) .......................... P 2001-31624

(51) Int. Cl.
*H01L 21/20* (2006.01)
(52) U.S. Cl. ..................................... 438/486; 438/482
(58) Field of Classification Search ............... 438/486, 438/482
See application file for complete search history.

(56) References Cited

U.S. PATENT DOCUMENTS

| | | | |
|---|---|---|---|
| 6,262,845 | B1 | 7/2001 | Sweatt |
| 6,726,768 | B1 * | 4/2004 | Yoon .......................... 117/103 |
| 2002/0083557 | A1 | 7/2002 | Jung |
| 2002/0168577 | A1 | 11/2002 | Yoon |
| 2003/0128917 | A1 | 7/2003 | Turpin et al. |

\* cited by examiner

*Primary Examiner*—W. David Coleman
*Assistant Examiner*—Nicholas J. Tobergte
(74) *Attorney, Agent, or Firm*—McKenna Long & Aldridge LLP

(57) ABSTRACT

A mask and its application in sequential lateral solidification (SLS) crystallization of amorphous silicon. The mask includes a light absorptive portion for blocking a laser beam and first and second light-transmitting portions each having an echelon formation with a tier-shaped outline. The first and second light-transmitting portions pass a laser beam and include a plurality of adjacent rectangular-shaped patterns that comprise the echelon formation. The second light-transmitting portion is located between the first light-transmitting portions and has fewer shaped-shaped patterns than the first light-transmitting portions. In operation, the mask moves transversely by no more than the width of the shaped-shaped patterns as a laser performs SLS crystallization. The first and second light-transmitting portions control grain growth such that high quality polycrystalline silicon is formed.

15 Claims, 21 Drawing Sheets

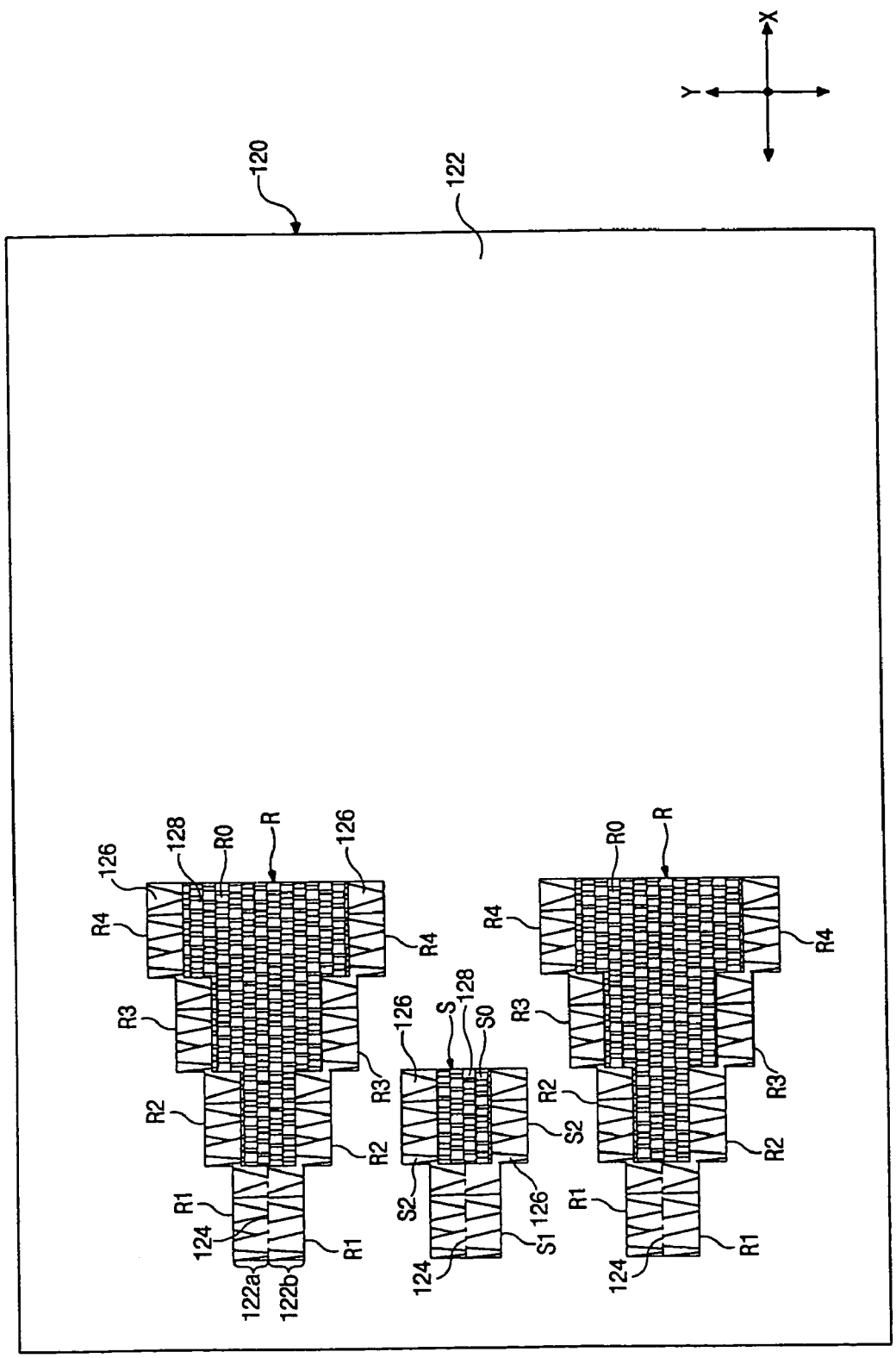

AMORPHOUS SILICON CRYSTALLIZATION METHOD

This application is a divisional of prior application Ser. No. 10/157,204, filed May 30, 2002.

This application claims the benefit of Korean Patent Application No. 2001-31624, filed on Jun. 7, 2001 in Korea, which is hereby incorporated by reference as it fully set forth herein.

BACKGROUND OF THE INVENTION

1. Field of the Invention

The present invention relates to crystallizing an amorphous silicon film, and, more particularly, to a sequential lateral solidification (SLS) crystallization method.

2. Discussion of Related Art

Polycrystalline silicon (p-Si) and amorphous silicon (a-Si) are often used as active layer materials for thin film transistors (TFTs) in liquid crystal display (LCD) devices. Since amorphous silicon (a-Si) can be deposited at a low temperature to form a thin film on a glass substrate, amorphous silicon (a-Si) is commonly used in liquid crystal displays (LCDs). Unfortunately, amorphous silicon (a-Si) TFTs have relatively slow display response times that limit their suitability for large area LCDs.

In contrast, polycrystalline silicon TFTs provide much faster display response times. Thus, polycrystalline silicon (p-Si) is well suited for use in large LCD devices, such as laptop computers and wall-mounted television sets. Such applications often require TFTs having a field effect mobility greater than 30 $cm^2/Vs$ and a low leakage current.

A polycrystalline silicon film is comprised of crystal grains having grain boundaries. The larger the grains and the more regular the grains boundaries, the better the field effect mobility. Thus, a crystallization method that produces large grains, ideally a single crystal, would be useful.

One method of crystallizing amorphous silicon into polycrystalline silicon is sequential lateral solidification (SLS). SLS crystallization uses the fact that silicon grains tend to grow laterally from the interface between liquid and solid silicon. With SLS, amorphous silicon is crystallized using a laser beam having a magnitude that melts amorphous silicon such that the melted silicon forms laterally grown silicon grains upon re-crystallization.

FIG. 1A is a schematic configuration of a conventional sequential lateral solidification (SLS) apparatus, while FIG. 1B shows a plan view of a conventional mask 38 that is used in the apparatus of FIG. 1A. In FIG. 1A, the SLS apparatus 32 includes a laser source 36, a mask 38, a condenser lens 40, and an objective lens 42. The laser source 36 emits a laser beam 34. The intensity of the laser beam 34 is adjusted by an attenuator (not shown) that is located in the path of the laser beam 34. The laser beam 34 is condensed by the condenser lens 40 and is then directed onto the mask 38.

The mask 38 includes a plurality of slits "A" that pass the laser beam 34 and light absorptive areas "B" that absorb the laser beam 34. The width of each slit "A" effectively defines the grain size of the crystallized silicon produced by a first laser irradiation. Furthermore, the distance between the slits "A" defines the size of the lateral grain growth of amorphous silicon crystallized by the SLS method. The objective lens 42 is arranged below the mask and reduces the shape of the laser beam 34 that passed through the mask 38.

Still referring to FIG. 1A, an X-Y stage 46 is arranged adjacent the objective lens 42. The X-Y stage 46, which is movable in two orthogonal axial directions, includes an x-axial direction drive unit for driving the x-axis stage and a y-axial direction drive unit for driving the y-axis stage. A substrate 44 is placed on the X-Y stage 46 so as to receive light from the objective lens 42. Although not shown in FIG. 1A, it should be understood that an amorphous silicon film is on the substrate 44, thereby defining a sample substrate.

To use the conventional SLS apparatus, the laser source 36 and the mask 38 are typically fixed in a predetermined position while the X-Y stage 46 moves the amorphous silicon film on the sample substrate 44 in the x-axial and/or y-axial direction. Alternatively, the X-Y stage 46 may be fixed while the mask 38 moves to crystallize the amorphous silicon film on the sample substrate 44.

When performing SLS crystallization, a buffer layer is typically formed between the substrate and the amorphous silicon film. Then, the amorphous silicon film is deposited on the buffer layer. Thereafter, the amorphous silicon is crystallized as described above. The amorphous silicon film is usually deposited on the buffer layer using chemical vapor deposition (CVD). Unfortunately, that method produces amorphous silicon with a lot of hydrogen. To reduce the hydrogen content the amorphous silicon film is typically thermal-treated, which causes de-hydrogenation, which results in a smoother crystalline silicon film. If de-hydrogenation is not performed, the surface of the crystalline silicon film is rough and the electrical characteristics of the crystalline silicon film are degraded.

FIG. 2 is a plan view showing a substrate 44 having a partially-crystallized amorphous silicon film 52. When performing SLS crystallization, it is difficult to crystallize all of the amorphous silicon film 52 at once because the laser beam 34 has a limited beam width, and because the mask 38 also has a limited size. Therefore, the substrate 38 is typically moved numerous times such that crystallization is repeated at various locations such that the substrate is completely crystallized. In FIG. 2, an area "C" that corresponds to one mask position is called a block. Crystallization of the amorphous silicon within the block "C" is achieved by irradiating the laser beam several times.

SLS crystallization of the amorphous silicon film 52 will be explained as follows. FIGS. 3A to 3C are plan views showing one block of an amorphous silicon film 52 being crystallized using a conventional SLS method. In the illustrated crystallization, it should be understood that the mask 38 (see FIGS. 1A and 1B) has three slits.

The length of the lateral growth of a grain is determined by the energy density of the laser beam, by the temperature of the substrate, and by the thickness of amorphous silicon film (as well as other factors). The maximum lateral grain growth should be understood as being dependent on optimized conditions. In the SLS method shown in FIGS. 3A to 3C, the width of a slit is twice as large as the maximum lateral grain growth.

FIG. 3A shows the initial step of crystallizing the amorphous silicon film 52 using a first laser beam irradiation. As described with reference to FIG. 1A, the laser beam 34 passes through the mask 38 and irradiates one block of an amorphous silicon film 52 on the sample substrate 44. The laser beam 34 is divided into three line beams by the three slits "A." The three line beams irradiate and melt regions "D", "E" and "F" of the amorphous silicon film 52, reference FIG. 3A. The energy density of the line beams should be sufficient to induce complete melting of the amorphous silicon film 52. That is, the portion of the amorphous silicon film that is irradiated by the laser beam 34 is completely melted through to the buffer layer.

Still referring to FIG. 3A, after complete melting the liquid phase silicon begins to crystallize at the interfaces 56a and 56b of the solid phase amorphous silicon and the liquid phase silicon. Crystallization occurs such that grains grow laterally. Thus, as shown, lateral grain growth of grains 58a and 58b proceeds from the un-melted regions to the fully melted regions. Lateral growth stops when: (1) grains grown from interfaces collide near the middle section 50a of the melted silicon region; or (2) polycrystalline silicon particles are formed in the middle section 50a as the melted silicon region solidifies sufficiently to generate solidification nuclei.

Since the width of the slits "A" (see FIG. 1B) is twice as large as the maximum lateral growth of the grains 58a and 58b, the width of the melted silicon region "D," "E," and "F" is also twice as large as the maximum lateral growth length of the grains. Therefore, the lateral grain growth stops when the polycrystalline silicon particles are formed in the middle section 50a. Such polycrystalline silicon particles act as solidification nuclei in a subsequent crystallization step.

As discussed above, the grain boundaries in directionally solidified silicon tend to form perpendicular to the interfaces 56a and 56b between the solid phase amorphous silicon and the liquid phase silicon. Thus, as a result of the first laser beam irradiation, crystallized regions "D," "E," and "F" are formed. Additionally solidification nuclei regions 50a are also formed.

As previously mentioned, the length of lateral grain growth attained by a single laser irradiation depends on the laser energy density, the temperature of substrate, and the thickness of the amorphous silicon film. Typically, lateral grain growth ranges from 1 to 1.5 micrometers ($\mu$m).

FIG. 3B illustrates crystallizing the amorphous silicon film 52 of FIG. 3A using a second laser beam irradiation. After the first laser beam irradiation, the X-Y stage or the mask 38 moves in a direction along the lateral grain growth of the grains 58a or 58b (in FIG. 3A), i.e., in the X direction, by a distance that is no more than the maximum length of the lateral grain growth. Then, a second laser beam irradiation is conducted. The regions irradiated by the second laser beam are melted and crystallized as described above. The silicon grains 58a and 58b and/or the nuclei regions 50a produced by the first laser beam irradiation serve as seeds for the second crystallization. Thus the lateral grain growth proceeds in the second melted regions. Silicon grains 58c formed by the second laser beam irradiation continue to gross adjacent to the silicon grains 58a formed by the first laser beam irradiation, and silicon grains 58d grown from an interface 56c are also formed. The lateral growth of these grains 58c and 58d stops when the nuclei regions 50b are formed in a middle section of the silicon region melted by the second laser beam irradiation.

Accordingly, by repeating the foregoing steps of melting and crystallizing, one block of the amorphous silicon film is crystallized to form grains 58e as shown in FIG. 3C.

The above-mentioned crystallization processes conducted within one block are repeated block by block across the amorphous silicon film. Therefore, the large size amorphous silicon film is converted into a crystalline silicon film. While generally successful, the conventional SLS method described above has disadvantages.

Although the conventional SLS method produces large size grains, the X-Y stage or the mask must repeatedly move a distance of several micrometers to induce lateral grain growth. Therefore, the time required to move the X-Y stage or the mask 38 occupies a major part in the total process time. This significantly decreases manufacturing efficiency.

FIG. 4 is a plan view of a mask 60 that is used in another SLS method. The mask 60 has light slits "G" and light absorptive areas "H." Although the mask 60 is similar to the mask 38 shown in FIG. 1B, the width of the lateral stripe-shaped slits "G" is less than twice the maximum lateral grain growth length. Due to the smaller width of the slits "G" the lateral grain growth stops when the grains generated at the interface between the un-melted regions and the fully melted regions. In contrast to the crystallization described in FIGS. 3A to 3C, solidification nuclei regions 50a and 50b are not formed when using the mask.

The SLS using the mask 60 will now be discussed. As described with reference to FIG. 1A, the laser beam 34 passes through the mask 60 and irradiates the amorphous silicon film on the sample substrate 44. The laser beam 34 is divided into three line beams because there are three slits "G". Those line beams are reduced by the objective lens 42 to create beam patterns on the amorphous silicon film 52. As crystallization proceeds, the beam patterns move in an X-axis direction. Because of the X-axis directional movement, crystallization is conducted along a length of the beam pattern. As previously described, the X-Y stage 46 or the mask 60 moves by a distance of several millimeters (mm). The larger movement reduces processing time when compared to the SLS method described with reference to FIGS. 3A to 3C.

FIGS. 5A to 5C are plan views showing an amorphous silicon film in the crystallization being crystallized using the mask shown in FIG. 4. It is assumed that the mask 60 has three slits. As mentioned above, the length of lateral grain growth is determined by the energy density of the laser beam 34, the temperature of substrate, the thickness of amorphous silicon film, etc. Thus lateral grain growth of the grains is the maximized under optimized conditions. In FIGS. 5A to 5C, it should be understood that the width of the slits "G" (in FIG. 4) is smaller than twice the maximum length of lateral grain growth.

FIG. 5A shows an initial step of crystallizing the amorphous silicon film. Referring to FIGS. 1A and 5A, the laser beam 34 emitted from the laser source 36 passes through the mask 60 (which replaces the mask 38) and irradiates a first block $E_1$ of an amorphous silicon film 62 deposited on the sample substrate 44. The laser beam 34 is divided into three line beams by the slits "G" The three line beams irradiate and melt regions "I," "J," and "K" of the amorphous silicon film 62. Since each of the melted regions "I," "J," and "K" corresponds to a slit "G," the width of the melted regions "I," "J," and "K" is less than twice the maximum lateral grain growth. The energy density of the line beams should be sufficient to induce complete melting of the amorphous silicon film.

The liquid phase silicon begins crystallize at the interfaces 66a and 66b of the solid phase amorphous silicon and the liquid phase silicon. Namely, lateral grain growth of the grains 68a and 68b proceeds from un-melted regions to the fully melted regions. Then, lateral growth stops where the grains 68a and 68b collide along a middle line 60a of the melted silicon region. The grain boundaries tend to form perpendicular to the interfaces 66a and 66b. As a result of the first laser beam irradiation, the first block $E_1$ is partially crystallized. Thereafter, by moving the X-Y stage the beam patterns move in the X-axis direction. A second irradiation is conducted and the second block $E_2$ is partially crystallized. The crystallization in the X-axis direction is then repeated to form a third block $E_3$.

As a result of the first to third laser beam irradiations described in FIG. 5A, crystallized regions "I," "J," and "K" are formed, each having first to third blocks $E_1$, $E_2$ and $E_3$.

In FIG. 5B, after the first set of laser beam irradiations the X-Y stage or the mask moves in a direction opposite to the lateral growth of the grains 68a or 68b by a distance equal to or less than the maximum length of the lateral growth. Crystallization is then conducted block by block in the X-axis direction. Therefore, the regions irradiated by the laser beam are melted and then crystallized in the manner described in FIG. 5A. At this time, the silicon grains 68a or/and 68b grown by the first to third laser beam irradiations serve as seeds for this crystallization. Silicon grains 68c formed by sequential lateral solidification (SLS) continue to grow adjacent to the silicon grains 68a of FIG. 5A, and silicon grains 68d solidified from an interface 66c are also formed. These grains 68c and 68d collide with each other at a middle line 60b of the silicon regions melted by the laser beam irradiation, thereby stopping the lateral grain growth.

Accordingly, by repeating the foregoing steps of melting and crystallizing the amorphous silicon, the blocks $E_1$, $E_2$ and $E_3$ of the amorphous silicon film become crystallized to form grains 68e as shown in FIG. 5C. FIG. 5C is a plan view showing a crystalline silicon film that resulted from lateral growth of grains to predetermined sizes.

The conventional SLS methods described in FIGS. 3A to 3C and 5A and 5C have some disadvantages. The conventional SLS method takes a relatively long time to crystallize the amorphous silicon film, thereby causing a decrease in manufacturing efficiency. Furthermore, due to the width of the slits of the mask, the length of lateral grain growth is limited.

More rapid crystallization can be achieved using masks having different slit patterns and laser beam scanning in a horizontal direction as shown in FIG. 6. As shown in FIG. 6, a mask 70 includes a plurality of slit patterns 72 that are divided into a first group "M" and a second group "N." First slit patterns 72a are in the first group "M" and second slit patterns 72b are in the second group "N". Intervals "O" are between the first slit patterns 72a and between the second slit patterns 72b. Thus, as shown in FIG. 6, each first slit pattern 72a is opposite an interval "O" between the second slit patterns 72b, and each second slit pattern 72b is opposite an interval "O" between the first slit patterns 72a. Referring to FIG. 6, it can be seen that the width of the slit patterns 72 is greater than the interval "O." The width of the slit patterns 72 should be the same as or less than the maximum lateral grain growth.

Therefore, when the mask 70 or a X-Y stage moves in a transverse direction (i.e., x-axial direction and to the right) after a first amorphous silicon crystallization step, the first slit patterns of the first group "M" are positioned over locations previously covered by the intervals "O." Accordingly, grains having a desired grain size can be obtained by repeatedly moving the mask 70 in the transverse direction during the amorphous silicon crystallization. Crystallization of amorphous silicon film using the mask 70 will be explained in detail with reference to FIGS. 7A to 7F.

FIG. 7A shows an initial step of crystallizing an amorphous silicon film using the mask of FIG. 6. As described with reference to FIG. 1A, the laser beam 34 passes through the mask 70 (which replaces the mask 38) and irradiates the amorphous silicon film 80 on the sample substrate 44. When applying the laser beam 34 to the amorphous silicon film 80, the laser beam 34 scans along the x-axial direction. Laser beam patterns having the same shape as the slit patterns 72 of the mask 70 partially melt the amorphous silicon film 80 and make first and second melted regions 86a and 86b, respectively, in first and second melted groups "P1" and "P2." The first and second melted groups correspond to the first and second slit groups "M" and "N". The energy density of the line beams should be sufficient to induce complete melting of the amorphous silicon film 80 through to an underlying buffer layer.

Still referring to FIG. 7A, after complete melting, the liquid phase silicon begins to crystallize at the interfaces 84a and 84b between the solid phase amorphous silicon and the liquid phase silicon. Namely, lateral grain growth of grains 82a and 82b proceeds from the un-melted regions to the fully melted regions. Then, lateral growth stops in accordance with the width of the melted silicon regions 86a and 86b where the grains 82a and 82b collide along the middle lines 84c of the melted silicon regions. The grain boundaries in directionally solidified silicon tend to form perpendicular to the interfaces 84a and 84b between the solid phase amorphous silicon and the liquid phase silicon. As a result of the first laser beam scanning, the first and second melted groups "P1" and "P2" are partially crystallized. Here, all of the crystallized regions 86 have the same size and shape, and thus, the first partially crystallized group "P1" is the same as, but offset from, the second partially crystallized group "P2."

Referring now to FIG. 7B, thereafter, by moving the X-Y stage where the substrate is mounted, the beam patterns move in the X-axis direction by the length "Q" of the crystallized regions 86. Thus, the first slit patterns 72a of the first slit group "M" are located over the second partially crystallized group "P2," and the second slit patterns 72b of the second slit group "N" are located over a new regions of the amorphous silicon film 80. Especially, the first slit patterns 72a is positioned between the second crystallized regions 86b. Thereafter, second laser beam scanning is conducted, and thus, the silicon regions irradiated by the second laser beam are melted and crystallized.

Now referring to FIG. 7C, an overlapped region "R1" which is exposed to the first and second laser beam scanning is completely crystallized to have a predetermined width "T." Simultaneously, another partially crystallized group "R2" is formed next to the region "R1". In other words, after the second laser beam scanning and crystallization, new grains having a laterally growing grain length "S" are then formed. Since the new grains 88 continue to grow adjacent to the first grains 82a, the grain length "S" of the new grains 88 is the same as a length from the first middle line 84c (which is formed by the first crystallization) to a second middle line 84d (which is formed by the second crystallization).

After the second laser beam scanning and crystallization, the mask 70 moves again in an x-axial direction for a third laser beam scanning by the length "Q" of the crystallized regions. Thus, the first slit group "M" having the first slit patterns 72a is located over the partially crystallized group "R2," as shown in FIG. 7D. By a third laser beam scanning and crystallization, the partially crystallized group "R2" becomes a completely crystallized region "R3" as shown in FIG. 7E.

By repeatedly carrying out the foregoing steps of melting and crystallizing, the amorphous silicon film 82 is converted into a polycrystalline silicon film 92 having grains 90 of length "S," reference FIG. 7F.

However, the conventional SLS method described with reference to FIGS. 1 to 7F has some problems. For example, the SLS method described with reference to FIGS. 3A to 3C (i.e., often referred to as Scan & Step SLS method) takes a rather long time to crystallize the amorphous silicon film, thereby decreasing manufacturing yields and throughput. The SLS method described with reference to FIGS. 5A to 5C (i.e., often referred to as Continuous SLS method) and the SLS method described with reference to FIGS. 7A to 7F (i.e., often referred to as Single Scan SLS method) take a shorter time than the Scan & Step SLS method, but they have limited laser beam patterns widths. Namely, since the width of the laser beam patterns is less than or equal to the maximum length of the lateral grain growth, the grain size is limited. The sizes of the grains formed by the aforementioned methods are shown in Table 1. Table 1 also shows the number of substrates that are processed in accordance with the lateral grain growth length (micrometer; μm) in each crystallization method.

TABLE 1

| Crystal-lization Method | Lateral Grain Growth (Mm) | | | | | | | | | |
|---|---|---|---|---|---|---|---|---|---|---|
| | 1.75 | 2.5 | 4 | 7 | 10 | 13 | 16 | 19 | 22 | 30.25 |
| Scan & Step | 2.1 | 2.1 | 2.0 | 1.9 | 1.9 | 1.8 | 1.7 | 1.7 | 1.6 | 1.5 |
| Continuous | 52.2 | 36.6 | 22.9 | 13.1 | 9.2 | 7.0 | 5.7 | 4.8 | 4.2 | 3.0 |
| Single Scan | 62.4 | 47.4 | 32.0 | 32.0 | 13.9 | 10.9 | 8.9 | 7.5 | 6.5 | 4.8 |

To get the results;
Exposure area = 1.5 × 25 mm$^2$
Laser frequency = 230 Hz
Glass substrate size = 370 × 470 mm$^2$
Stage stepping time = 0.4 sec.
Load & Unload time = 10 sec. (per substrate)
Maximum length of lateral grain growth = 1 micrometer (μm)
Substrate moving distance = 0.75 micrometers (μm)

From the results of Table 1, as the lateral grain growth length becomes larger, the manufacturing yields is reduced. Namely, the larger the lateral grain growth length, the less the throughput.

SUMMARY OF THE INVENTION

Accordingly, the present invention is directed to a method of crystallizing an amorphous silicon film using sequential lateral solidification (SLS) such that substantially obviates one or more of problems due to limitations and disadvantages of the related art.

An advantage of the present invention is to provide a sequential lateral solidification (SLS) method that saves time in crystallizing and increases productivity.

Another advantage of the present invention is crystallizing an amorphous silicon layer with increased manufacturing yield using an improved SLS method.

Additional features and advantages of the invention will beset forth in the description which follows, and in part will be apparent from the description, or may be learned by practice of the invention. The objectives and other advantages of the invention will be realized and attained by the method particularly pointed out in the written description and claims hereof as well as the appended drawings.

To achieve these and other advantages and in accordance with the purpose of the present invention, as embodied and broadly described, a method for crystallizing an amorphous silicon film includes locating a substrate having an amorphous silicon film in a sequential lateral solidification (SLS) apparatus; irradiating the amorphous silicon film using a laser beam that passes through a mask, wherein the mask includes a light absorptive portion for blocking the laser beam, a plurality of first echelon shaped light-transmitting portions having a tiered-pattern, and a second echelon shaped light-transmitting portion having a tiered-pattern, wherein the first and second echelon shaped light-transmitting portions pass the laser beam, wherein the second light-transmitting portion is located between the first light-transmitting portions, and wherein each tier has a fixed width, and wherein the laser beam portion that passes through the mask melts the amorphous silicon film into liquid silicon. The method further includes crystallizing melted regions such that the grain growth regions have laterally grown grains formed by growing laterally from an interface between liquid silicon and solid silicon. Then, transversely moving the mask to expose crystallized regions for a subsequent crystallization, and the performing a second crystallization such that laterally grown grains adjacent to the crystallized silicon particle regions continue to grow. The method further includes moving the mask in a longitudinal direction after the amorphous silicon film is crystallized in the transverse direction, and then conducting another transverse directional crystallization.

In another aspect, a mask for crystallizing an amorphous silicon film in a sequential lateral solidification (SLS) apparatus includes a light absorptive portion for blocking a laser beam; and first and second echelon shaped light-transmitting portions having a tier-shaped outline, wherein the first and second light-transmitting portions are for passing a laser beam. Each light-transmitting portion includes a plurality of adjacent rectangular patterns that form the echelon formation. The rectangular patterns beneficially have the same width, but different lengths. The width of the rectangular patterns range from 100 micrometers to 10 millimeters, whereas the lengths of the rectangular patterns are calculated using the following equation, $X^N=[X_{(N-1)}+G_N]$, where N is a natural number that is greater than one (N>1), $X_N$ is the length of the $N^{th}$ rectangular patterns, and $G_N$ is a length of lateral grain growth in the $N^{th}$ rectangular pattern. Beneficially, $G_N$ is a variable and is less than and equal to twice the maximum length of lateral grain growth. Adjacent rectangular form steps that are less than or equal to the maximum length of lateral grain growth. The second light-transmitting portion is located between the first light-transmitting portions and there are fewer rectangular patterns in the second light-transmitting portion than in the first light-transmitting portions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings:

FIGS. 9A to 9F are plan views showing amorphous silicon film crystallization using the mask of FIG. 8;

DETAILED DESCRIPTION OF THE ILLUSTRATED EMBODIMENTS

Reference will now be made in detail to illustrated embodiments of the present invention, examples of which are shown in the accompanying drawings. Wherever possible, similar reference numbers will be used throughout the drawings to refer to the same or like parts.

Figure 1A:
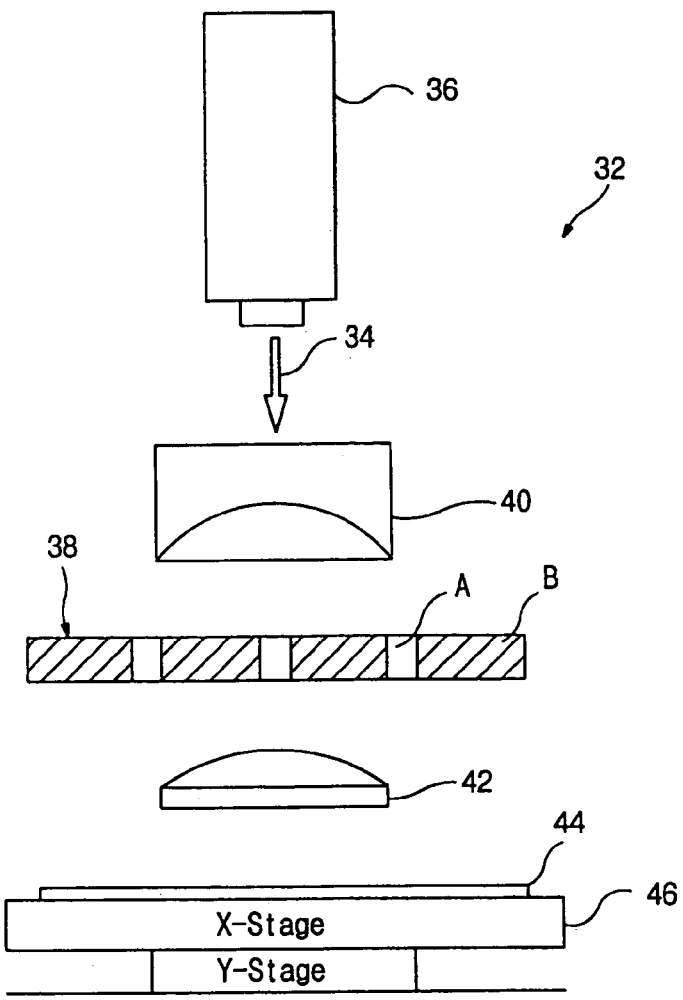
FIG. 1A is a schematic depiction of a sequential lateral solidification (SLS) apparatus according to a conventional art.
Figure 1B:
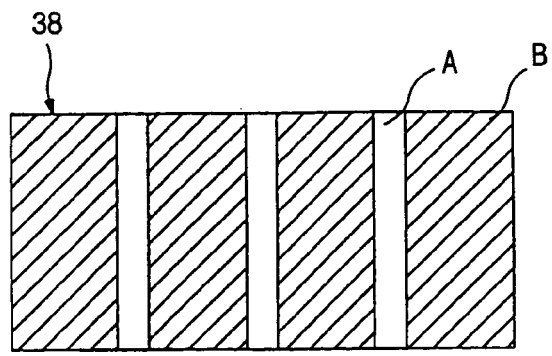
FIG. 1B is a plan view showing a mask used in the apparatus of FIG. 1A.
Figure 2:
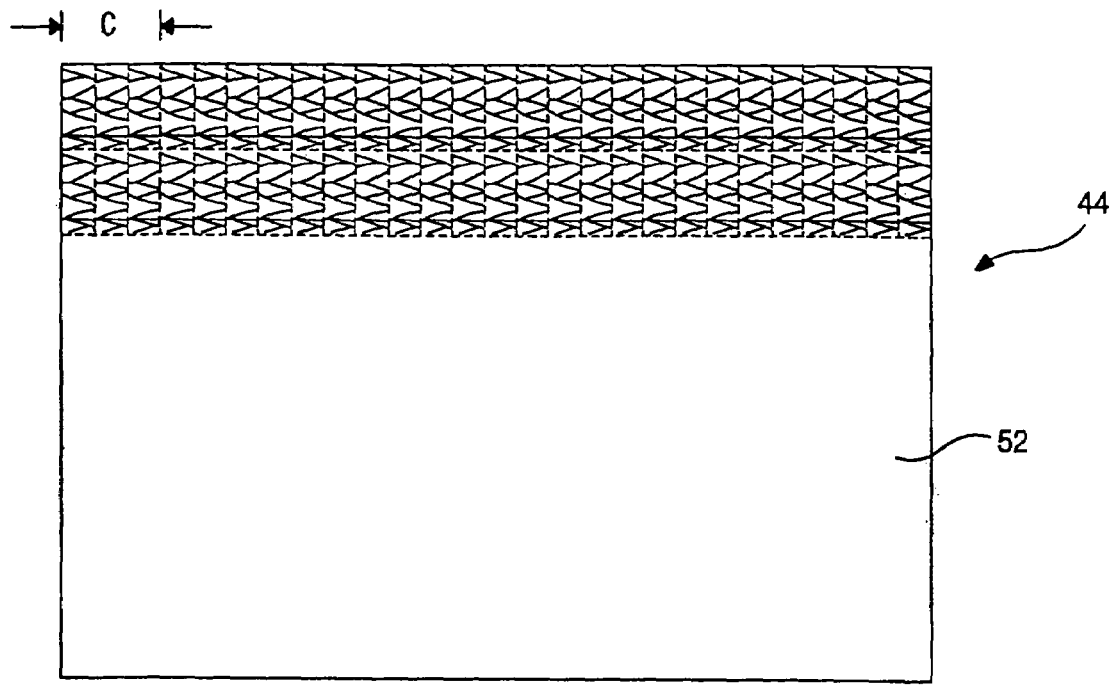
FIG. 2 is a plan view showing a substrate having a partially-crystallized amorphous silicon film.
Figure 3A:
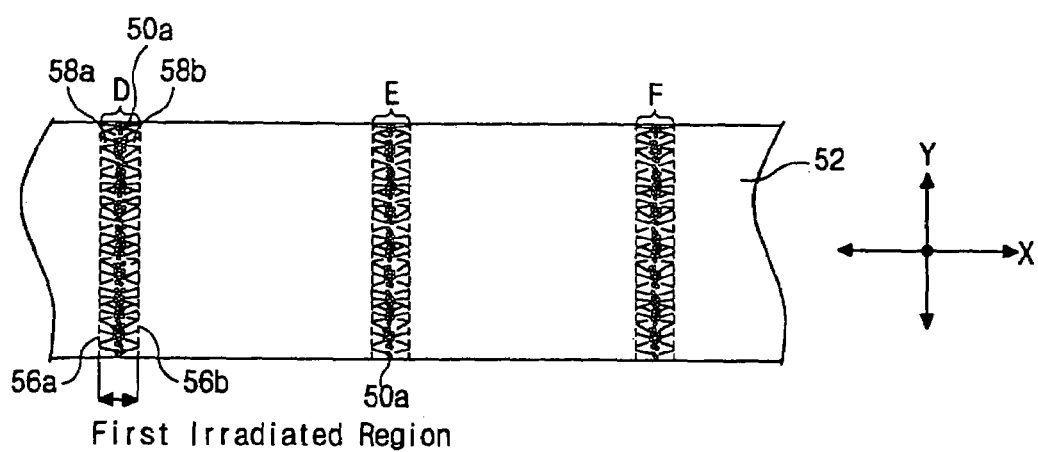
FIGS. 3A to 3C are plan views showing a block of amorphous silicon film being crystallized using conventional SLS.
Figure 3B:
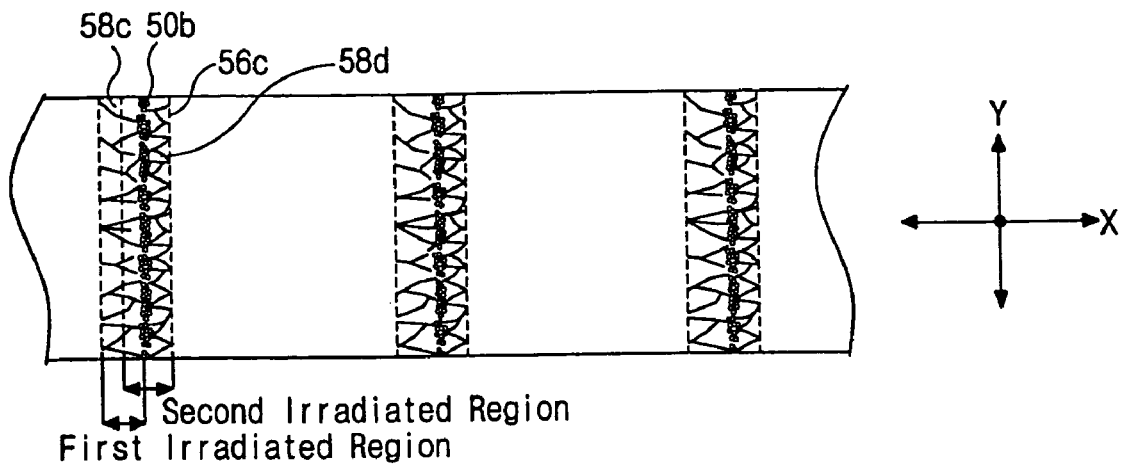
Figure 3C:
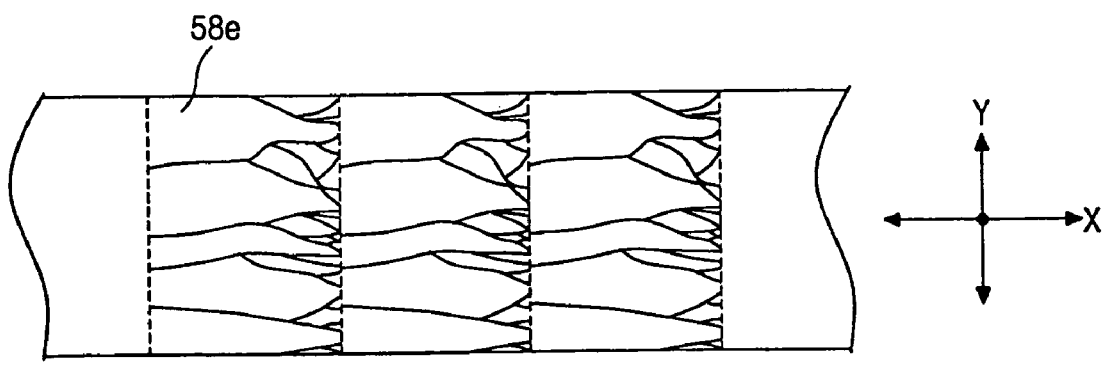
Figure 4:
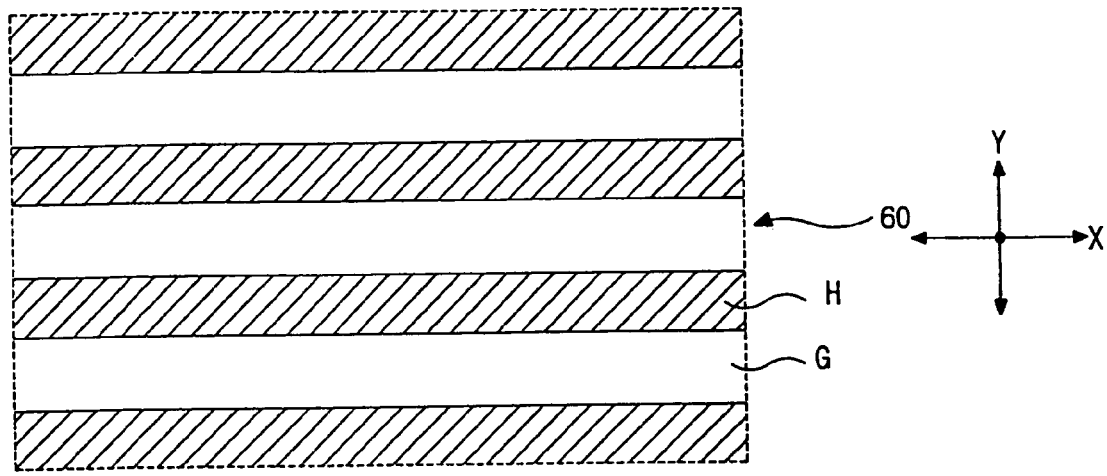
FIG. 4 is a plan view of a mask that is used for crystallization according to another conventional SLS method.
Figure 5A:
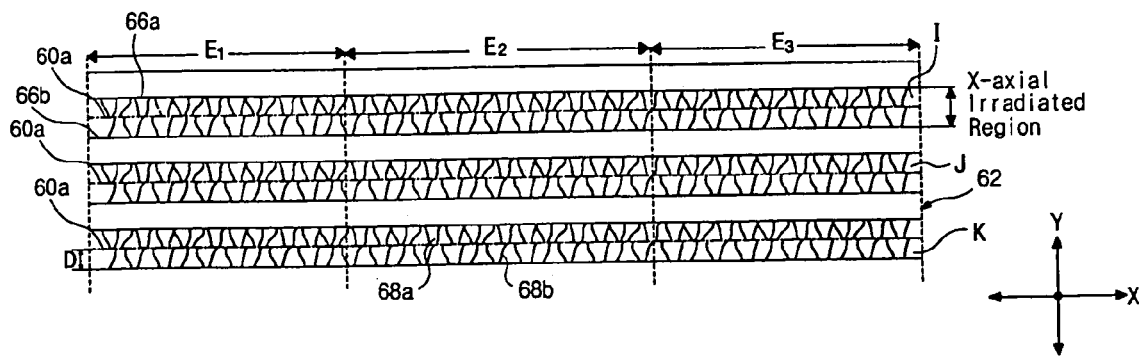
FIGS. 5A to 5C are plan views showing amorphous silicon film being crystallized using the mask shown in FIG. 4.
Figure 5B:
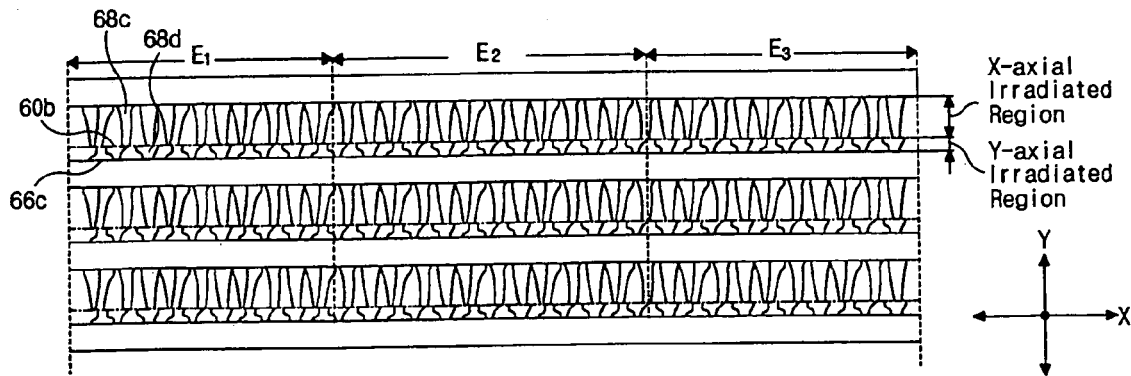
Figure 5C:
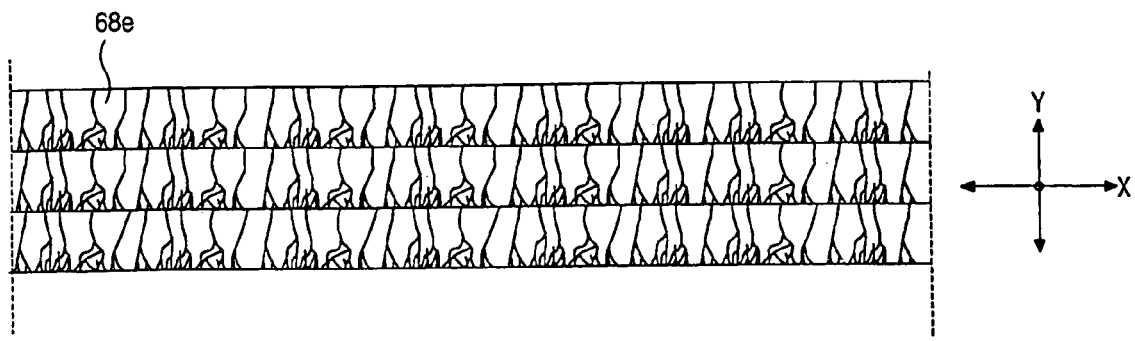
Figure 6:
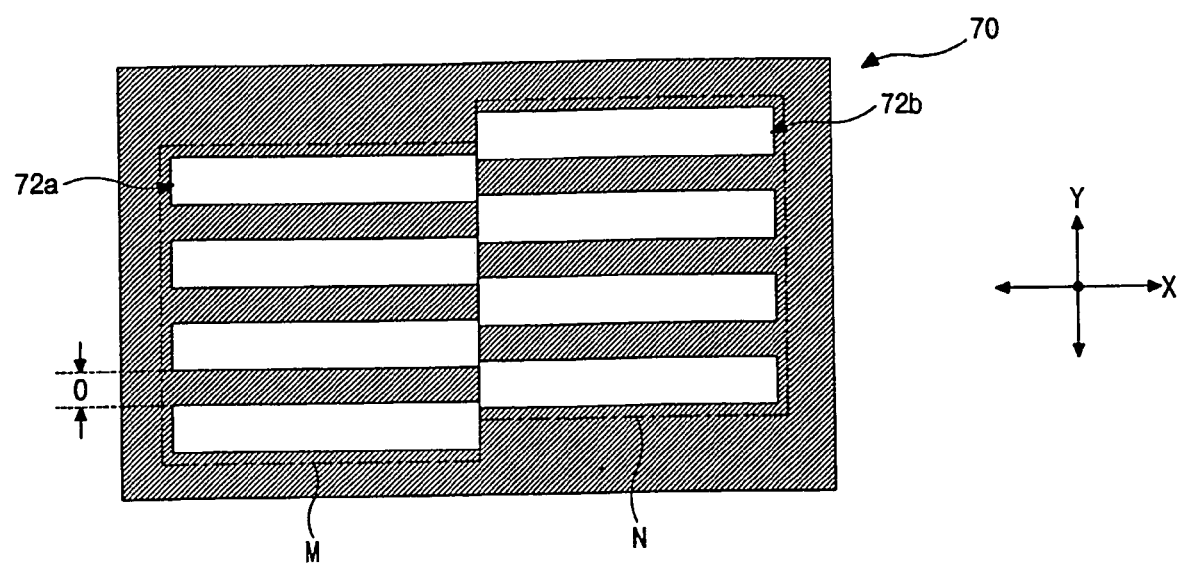
FIG. 6 is a plan view of a mask that is used for SLS crystallization according to another conventional SLS method.
Figure 7A:
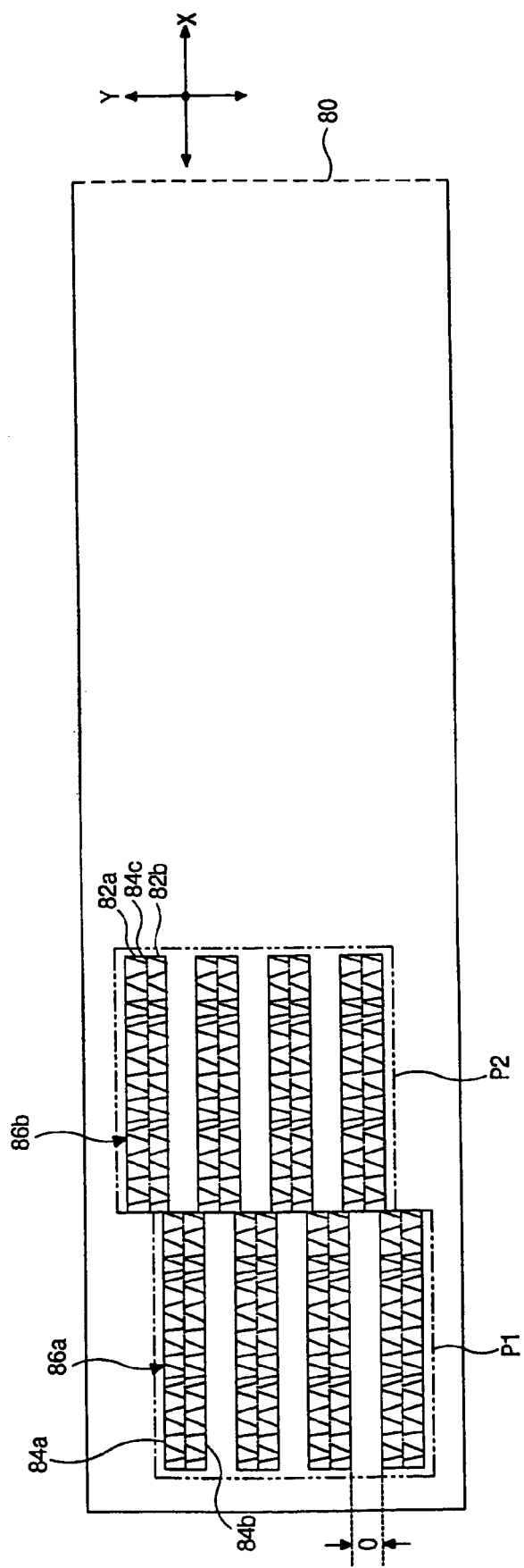
FIGS. 7A to 7F are plan views showing amorphous silicon film being crystallized using the mask shown in FIG. 6.
Figure 7B:
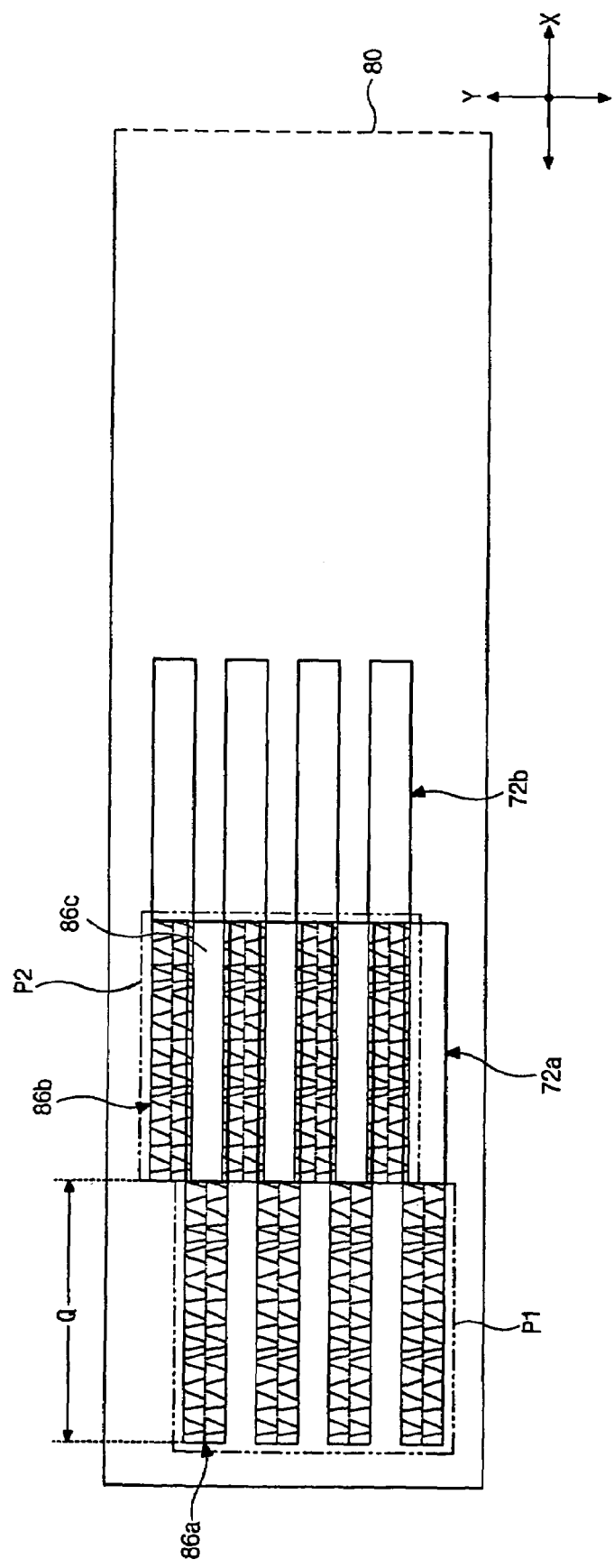
Figure 7C:
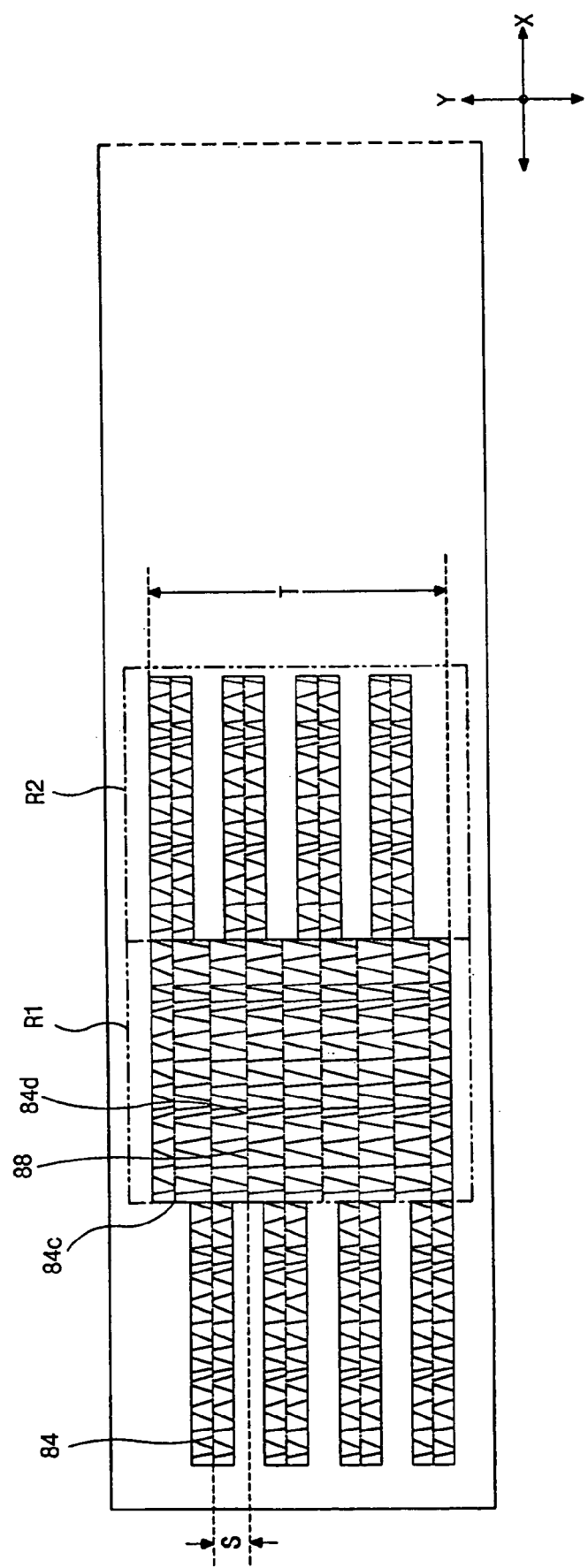
Figure 7D:
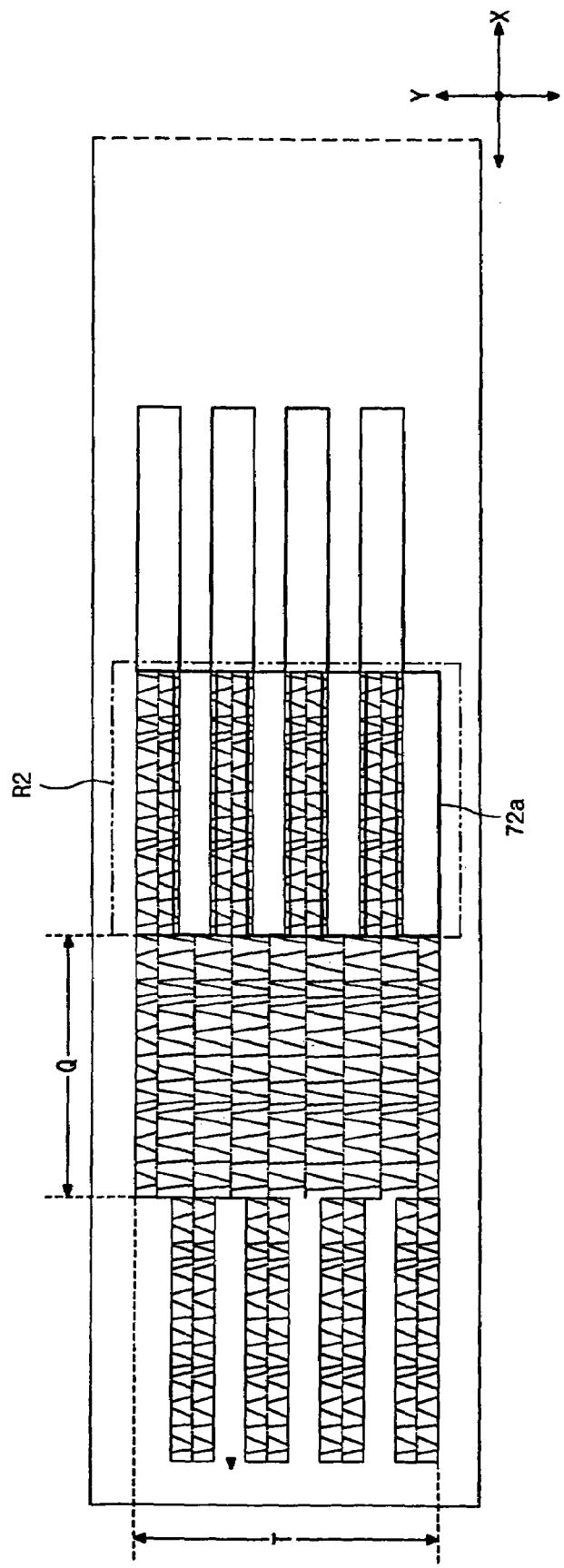
Figure 7E:
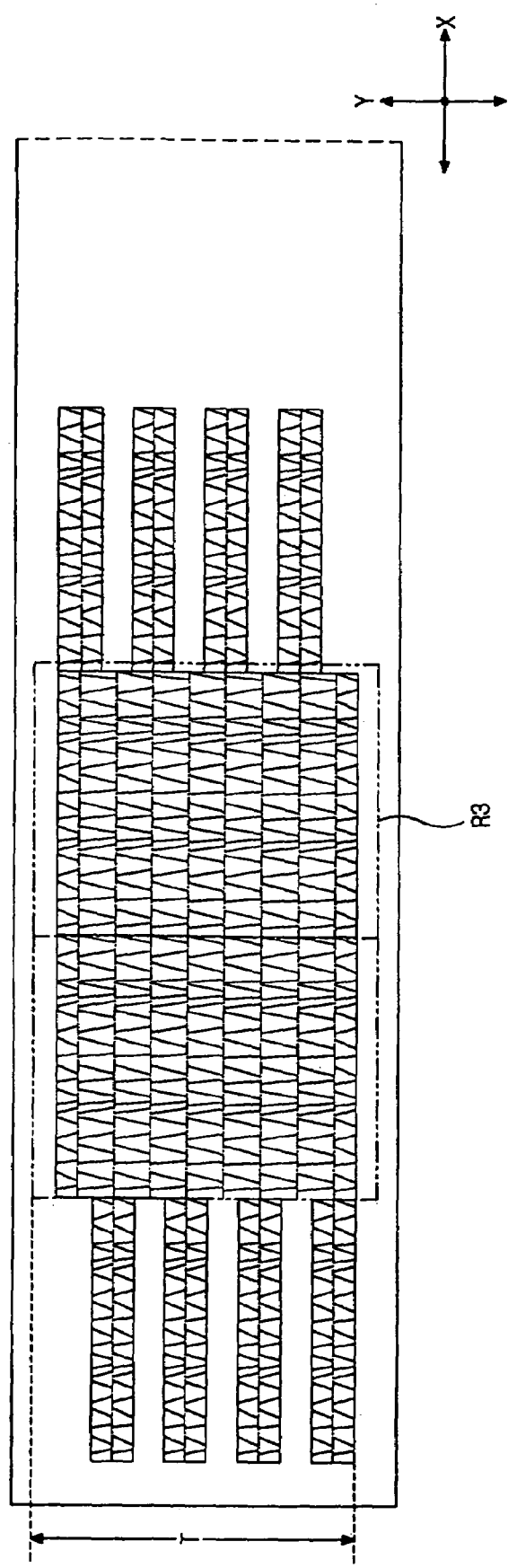
Figure 7F:
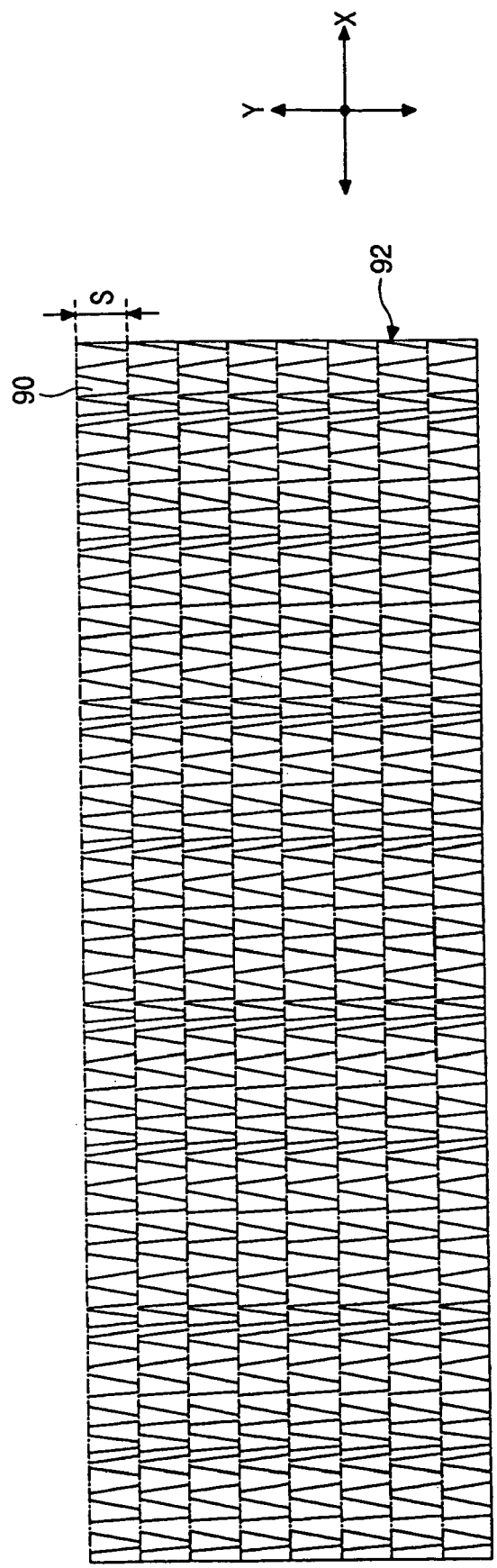
Figure 8:
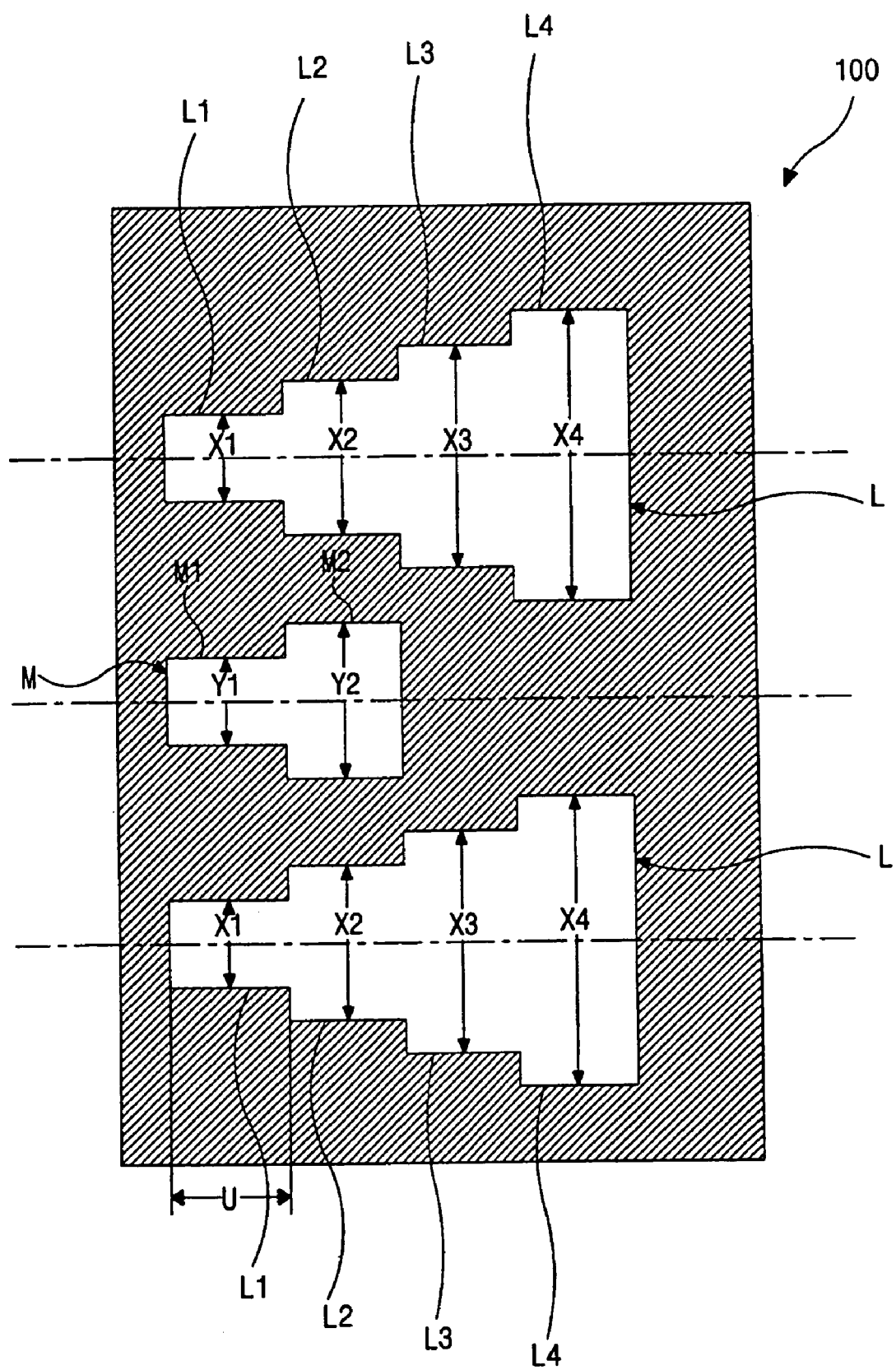
FIG. 8 is a plan view of a mask that is in accord with the principles of the present invention.

FIG. 8 is a plan view of a crystallization mask 100 according to the present invention. As shown, the mask 100 includes first and second light-transmitting portions, L and M, each having a tiered echelon formation outline. Namely, the first and second light-transmitting portions L and M have tier-shaped top and bottom outlines. Each of the first light-transmitting portions L is comprised of first to fourth rectangular-shaped patterns L1 to L4, all having the same width U. While four rectangular-shaped patterns are shown, the number of rectangular-shaped patterns in a first light-transmitting portion is not limited to four. However, the lengths X1 to X4 of the rectangular-shaped patterns L1 to L4 are different. The first length X1 of the first rectangular-shaped patterns L1 is less than or equal to twice the maximum length $G_{MAX}$ of lateral grain growth under optimized conditions. The lengths X2, X3, X4, . . . and XN are calculated as follows:

$$X_N = [X_{(N-1)} + G_N]$$ Equation (1)

where N is a natural number that is greater than one (N>1), $X_N$ is the length of the $N^{th}$ rectangular patterns, and $G_N$ is a length of lateral grain growth in the Nth rectangular patterns. $G_N$ is a variable such that the values of $G_N$ can be the same or different in the rectangular patterns L2 to LN. However, the middle of each rectangular-shaped pattern L1 to L4 is in the same axis, reference FIG. 8. Furthermore, the lengths X2, X3, X4, . . . and XN can also be calculated by the Equation (2), $X_N \leq [X_{(N-1)} + 2G_N]$.

As a result, the lengths X1 to X4 of the rectangular-shaped patterns L1 to L4 of the light-transmitting portions L is expressed, respectively, as follows:

$$X1 = G_{MAX}$$

$$X2 = X1 + G2$$

$$X3 = X2 + G3$$

$$X4 = X3 + G4$$

where, G2, G3 and G4 are less than or equal to twice the maximum length of lateral grain growth, as above-mentioned. It is supposed that X1, G2, G3 and G4 are equal to each other and are less than the maximum length $G_{MAX}$ of lateral grain growth [(X1=G2=G3=G4)<$G_{MAX}$]. If the $G_{MAX}$ is 3 micrometers ($G_{MAX}$=3 μm) and if the X1, G2, G3 and G4 are micrometers (X1=G2=G3=G4=2 μm), the lengths X1 to X4 of the rectangular-shaped patterns L1 to L4 are 2, 4, 6 and 8 micrometers (X1=2 μm, X2=4 μm, X3=6 μm, and X4=8 μm), respectively.

Still referring to FIG. 8, the second light-transmitting portion M, located between the first light-transmitting portions L, has rectangular-shaped patterns M1 and M2. Although FIG. 8 shows only two rectangular-shaped patterns M1 and M2 in the second light-transmitting portion M, the number of rectangular-shaped patterns is not limited to two, but that number should be less than the number of rectangular-shaped patterns of the first light-transmitting portions L. Since the second light-transmitting portion M is located between the first light-transmitting portions L, it crystallizes the amorphous silicon film area between the first light-transmitting portions L. The rectangular-shaped patterns M1 to MN of the second light-transmitting portion M have the same width U, but have different lengths. The first length Y1 of the first rectangular pattern M1 is less than or equal to twice the maximum length of lateral grain growth. Then, the lengths of the rectangular-shaped patterns M2 to MN (assuming there are more than two rectangular-shaped patterns) are determined by the above-mentioned Equation (1), $Y_N = [Y_{(N-1)} + G_N]$ or (2), $Y_N = [Y_{(N-1)} + G_N]$ or $Y_N \leq [Y_{(N-1)} + 2G_N]$. Therefore, if $G_{MAX}$ is 3 micrometers ($G_{MAX}$=3 μm) and if the Y1 and G2 are all 2 micrometers (X1=G2=2 μm), the lengths Y1 and Y2 of the rectangular patterns M1 and M2 are 2 and 4 micrometers (Y1=2 μm and Y2=4 μm), respectively. In practice, the width of the rectangular patterns L1 to LN and M1 to MN may be several hundred micrometers to several millimeters.

When using the mask 100 illustrated in FIG. 8 during SLS amorphous silicon crystallization, the method according to the present invention can crystallize a large area amorphous silicon film quicker than the conventional art. FIGS. 9A to 9F are plan views showing the crystallization process using the mask 100. For simplifying the explanation of the crystallization process, it will be assumed that the first lengths X1 and Y1 of the first rectangular patterns L1 and M2 are 2 micrometers (X1=Y1=2 μm) and that GN is also 2 micrometers (GN=2 μm). Furthermore, whenever the laser beam irradiates the amorphous silicon film, the mask 100 of FIG. 8 is positioned between the substrate and the laser source.

Referring now specifically to FIG. 9A, before crystallizing the amorphous silicon using the mask 100, a buffer layer (not shown) is formed on a substrate 120 and an amorphous silicon film 122 is deposited on the buffer layer. Then, the amorphous silicon film 122 on the substrate 120 is dehydrogenated. Thereafter, the mask 100 (in FIG. 8) is arranged above the substrate 120, which is fixed on the X-Y stage. The first laser beam irradiation is carried out such that the amorphous silicon portions that correspond to the first and second light-transmitting portions L and M are melted and subsequently crystallized.

Crystallized regions R and S that correspond to the light-transmitting portion L and M of FIG. 8 are thus formed. In each crystallized region R or S, there are grain growth regions R1–R4 and S1–S2 and crystallized silicon particle regions R0 and S0. Each of the grain growth regions R1–R4 and S1–S2 includes laterally growing grains 126 and each of the crystallized silicon particle regions includes polysilicon particles 128. The crystallized silicon particle regions R0 are formed in areas that correspond to the second to fourth rectangular patterns L2 to L4 and the crystallized silicon particle region S0 is formed in a area that corresponds to the second rectangular pattern M2.

When the first laser beam having a density sufficient to induce complete melting of the amorphous silicon film 122 irradiates that film, the regions R and S exposed via the first and second light-transmitting portions L and M are completely melted. When the first laser beam irradiation is stopped, the melted silicon rapidly crystallizes from interfaces between the solid phase amorphous silicon and the liquid phase silicon. Thus, laterally growing first grains 122a are formed in a downward direction from the interface to the center, and laterally growing second grains 122b are formed in an upward direction from the interface to the center. Therefore, the laterally growing first and second grains 122a and 122b meet in the central part of each first grain growth region R1 or S1, thereby inducing a middle line 124.

As shown in FIG. 9A, the length of the laterally grown grains 122a and 122b is less than or equal to the maximum possible length of lateral grain growth $G_{MAX}$. As mentioned before, the length of the lateral grain growth depends on the laser energy density, the temperature of substrate, and the thickness of the amorphous silicon film. After the first laser beam irradiation, the grains generated by lateral grain growth typically have a length of about 1 to 1.5 micrometers. Therefore, since the rectangular patterns L2 to LA and M2 of the mask 100 have a length greater than or equal to 4 micrometers ($\mu$m), the second to fourth grain growth regions R2 to R4 (and S2) do not have the middle line 124, but have crystallized silicon particle regions R0 and S0. Accordingly, the first grain growth regions R1 and S1 have laterally grown grains of 1 to 1.5 micrometers, whereas the second to fourth grain growth regions R2–R4 (and S2) have laterally grown grains only at their periphery and have the crystallized silicon particle regions R0 and S0 inside.

After the first laser beam irradiation, the X-Y stage or/and the mask 100 moves for the next laser beam irradiation by a distance of several hundred micrometers to several millimeters (mm) in the X-axial direction. Namely, the substrate 120 moves left, for example, by a distance that is less than or equal to the width U of the rectangular patterns, i.e., about several hundred micrometers to several millimeters.

Figure 9B:
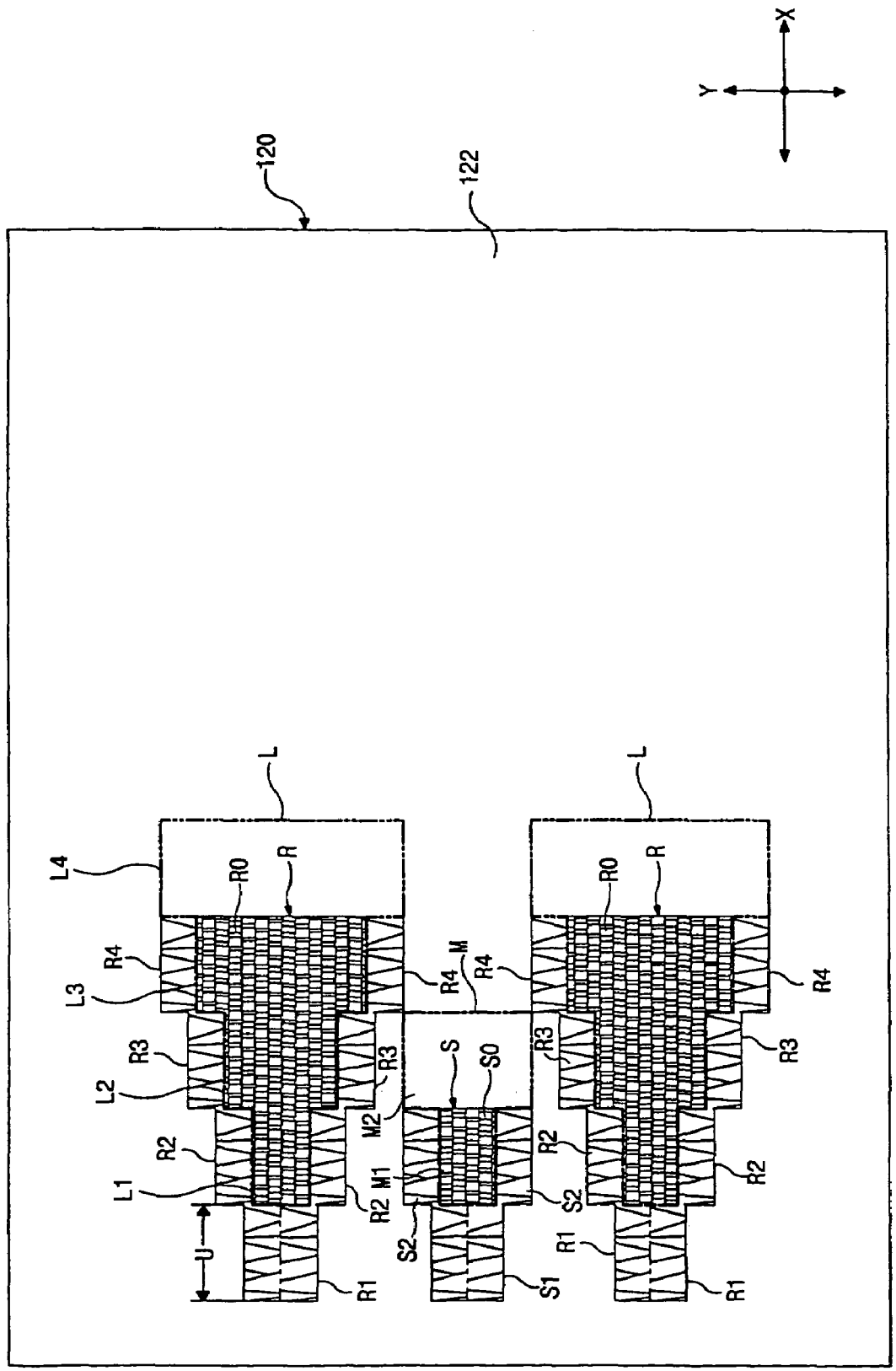

As a result, as shown in FIG. 9B, the first to third rectangular patterns L1–L3 are arranged above the second to fourth grain growth regions R2–R4, and the first rectangular pattern M1 is arranged above the second grain growth region S2. Thus, the first to third rectangular patterns L1–L3 are positioned to expose the crystallized silicon particle region R0 and portions of laterally growing grains 126. In this manner, the first rectangular pattern M1 is positioned to exposes the crystallized silicon particle region S0 and portions of laterally growing grains 126 of the second grain growth region S2. Additionally, the fourth rectangular patterns L4 are positioned to expose the amorphous silicon regions, and the second rectangular pattern M2 to exposes the amorphous silicon region. Then, a second laser beam irradiation is conducted through the first to fourth rectangular patterns L1–L4 (and S1–S2).

Figure 9C:
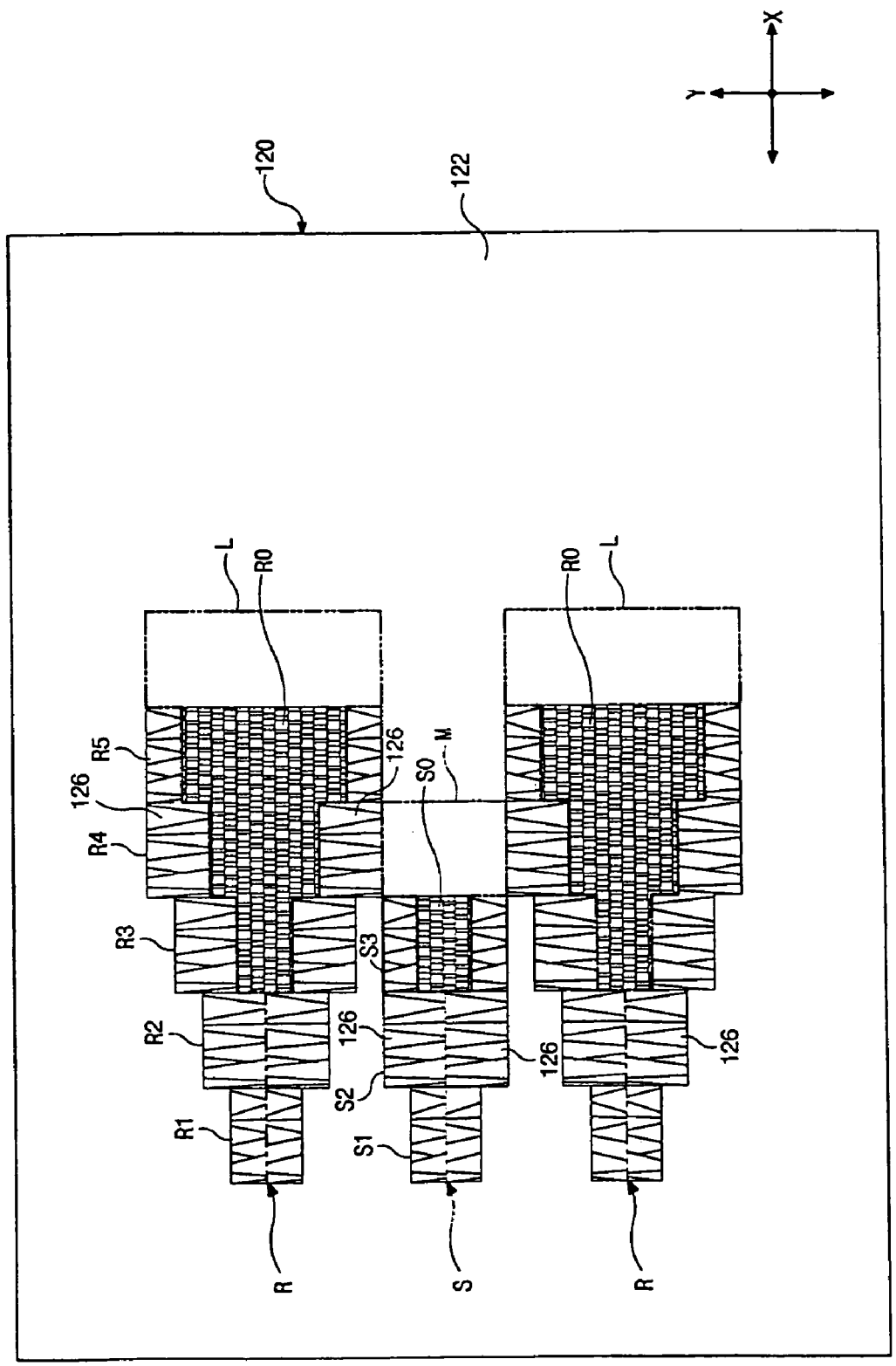

Therefore, while the second laser beam irradiation is carried out, the crystallized silicon particle regions R0 below the first to third rectangular patterns L1–L3 are re-melted. Additionally, the amorphous silicon regions below the fourth rectangular patterns L4 are also melted. After the second laser beam irradiation, the second grain growth regions R2 and S2 have the whole of the laterally growing grains that grow in a Y-axial direction as shown in FIG. 9C. Furthermore, the grains 126 formed by the first crystallization process also tend to grow in the Y-axial direction. The grains 126 of FIG. 9C formed by the second laser beam irradiation continue to grow adjacent the grains formed by the first laser beam irradiation in the second to fourth grain regions R2–R4. Thus, the grains tend to grow vertically against the interface between liquid and solid silicon. Amorphous regions R5 that the fourth rectangular patterns L4 expose during the second crystallization process are also crystallized, and an amorphous region S3 that the second rectangular pattern M2 expose is also crystallized. After the second crystallization process, the crystallized silicon particle regions R0 and S0 also exist in the third to fifth grains regions R3–R5.

After the second laser beam irradiation, the X-Y stage or/and the mask 100 moves in preparation for the next laser beam irradiation by a distance of several hundred micrometers ($\mu$m) to several millimeters (mm) in an X-axial direction. Namely, the substrate 120 moves left, for example, by a distance that is less than or equal to the width U of the rectangular patterns, i.e., about several hundred micrometers to several millimeters. Thus, the light-transmitting portions L and M are positioned to expose the crystallized silicon particle regions R0 and S0 and portions of the laterally growing grains of third to fifth grain growth regions R3–R5. Additionally, the fourth rectangular patterns L4 are positioned to expose new amorphous silicon regions, and the second rectangular pattern M2 is also positioned to expose another amorphous silicon region. Then, a third laser beam irradiation is conducted through the first to fourth rectangular patterns L1–L4 (and S1–S2).

As a result, while the third laser beam irradiation is carried out, the crystallized silicon particle regions R0 below the first to third rectangular patterns L1–L3 are re-melted and re-crystallized. Additionally, the amorphous silicon regions below the fourth rectangular patterns L4 are also melted and crystallized, thereby forming the sixth grain growth region R6 as shown in FIG. 9D.

Figure 9D:
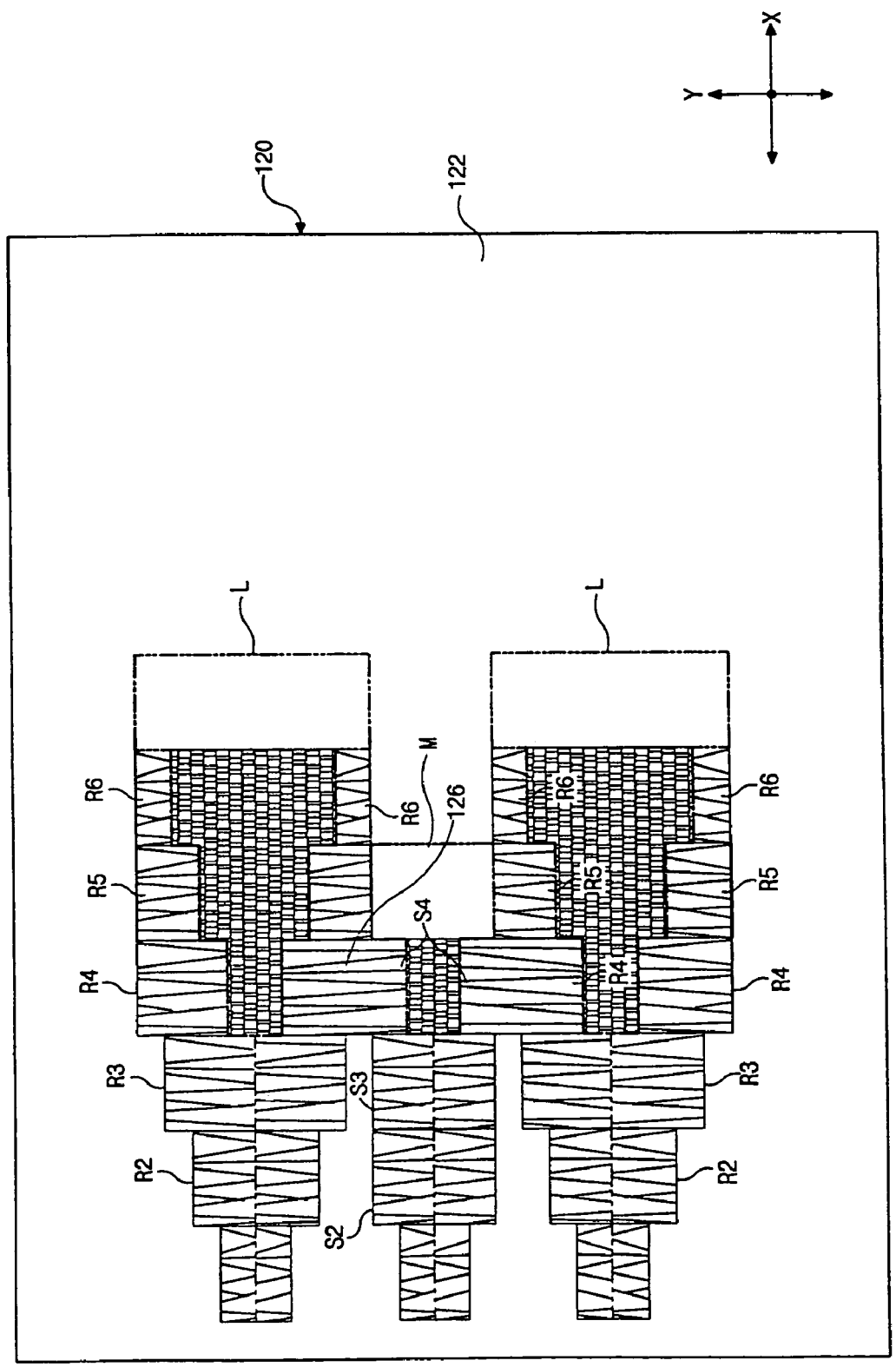

Referring now to FIG. 9D, the third grain growth regions R3 and S3 have grains that are fully extended in the Y-axial direction after the third laser beam irradiation. Furthermore, the grains of the fourth and fifth grain region, which are formed by the second crystallization process, are also extended in the Y-axial direction. Like the second laser beam irradiation, the grains formed by the third laser beam irradiation continue to grow adjacent to the grains formed by the second laser beam irradiation. Thus, the grains tend to grow laterally from the interface between liquid and solid silicon.

During the X-axial crystallization described in FIGS. 9A–9D, it is noticeable that the crystallized silicon particle regions R0 and S0 are converted into laterally grown grain regions. After the third laser beam irradiation, the laterally grown grains of the fourth grain growth region R4 are combined with those of the grain growth region S4. Furthermore, after the third crystallization process, the crystallized silicon particle regions R0 and S0 also exist in the fourth to sixth grains regions R4–R6.

Figure 9E:
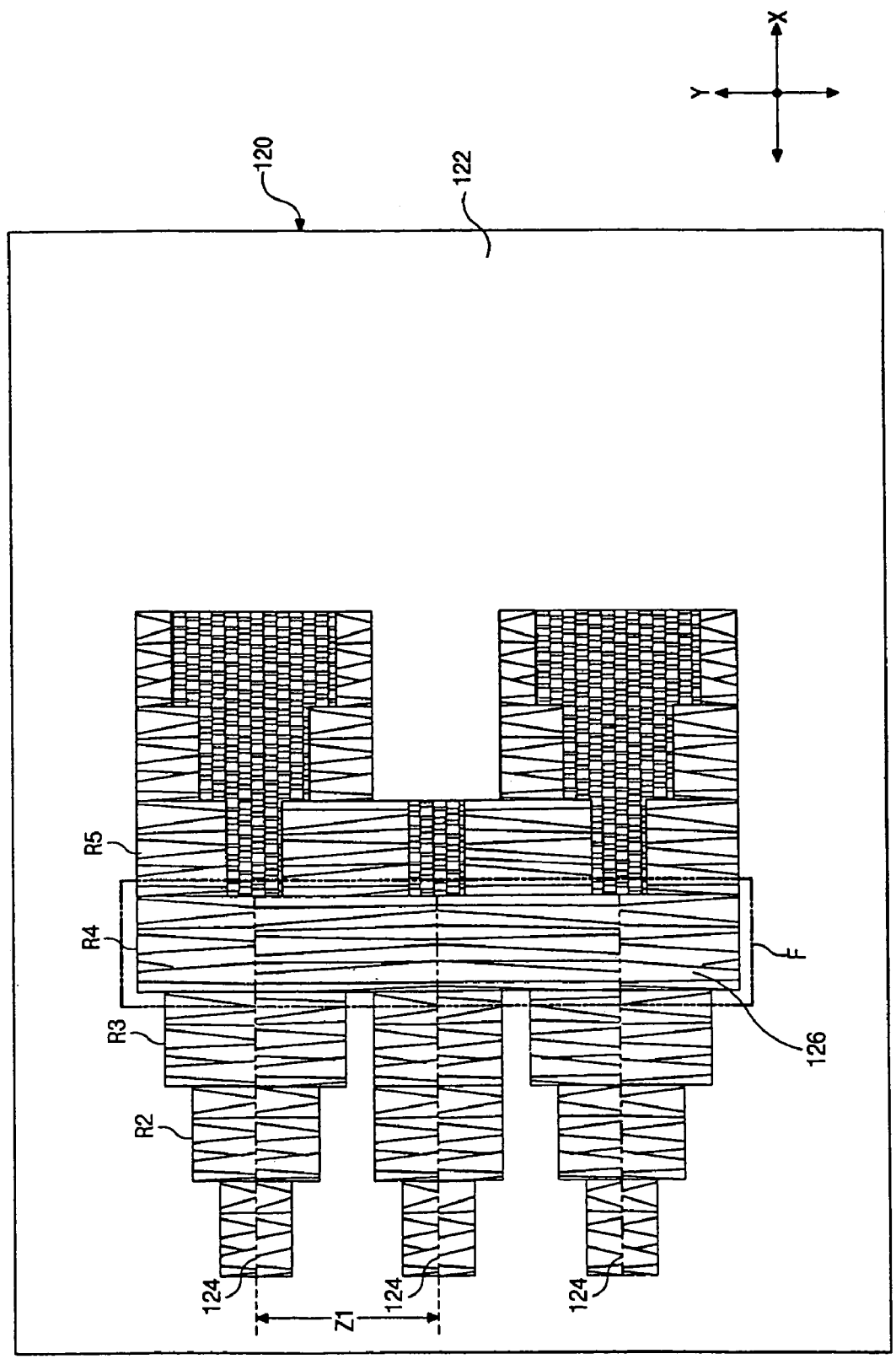
Figure 9F:
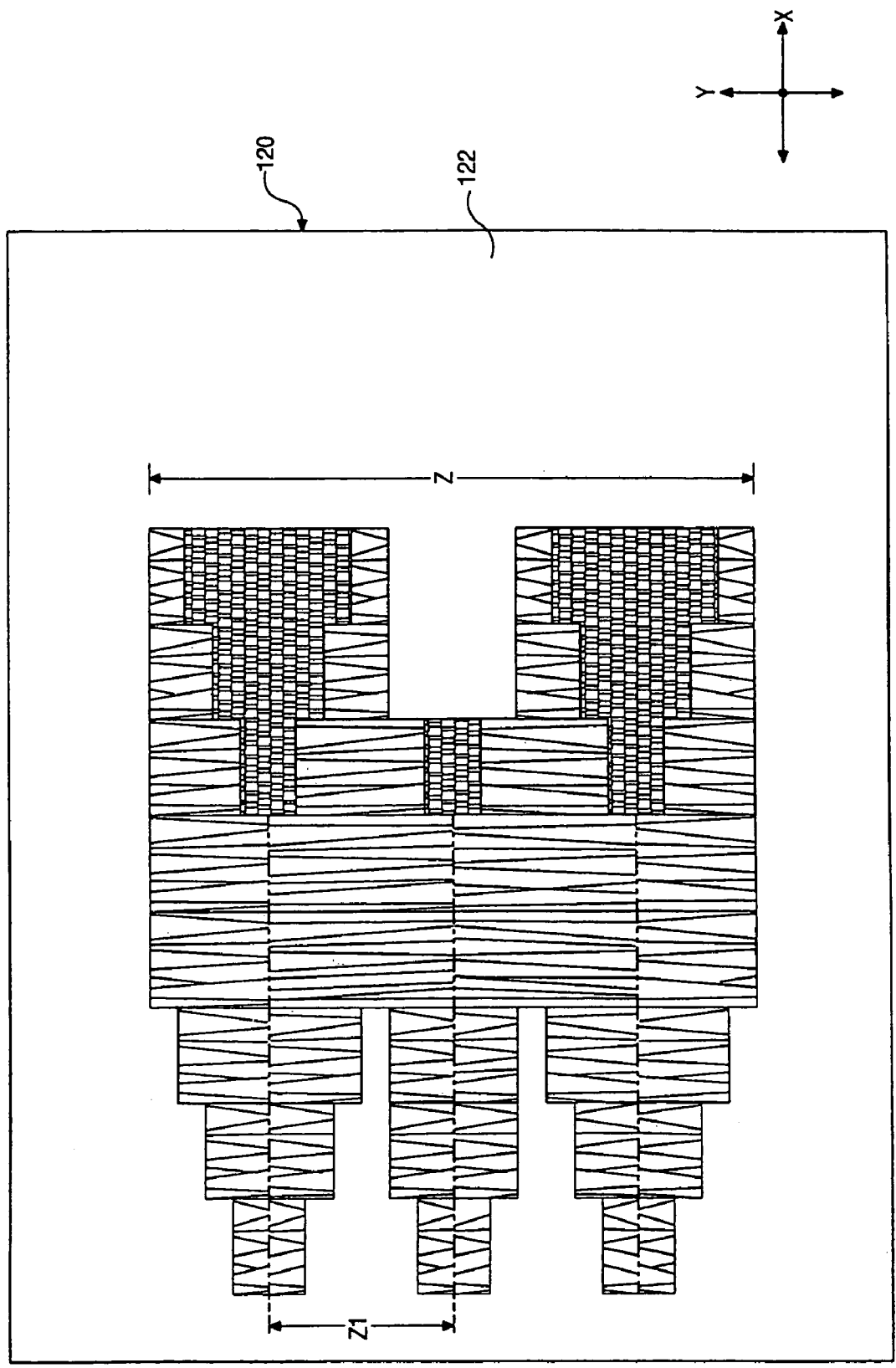

Referring now to FIGS. 9E and 9F, the repetition of the foregoing steps of melting and crystallizing forms a larger grain region F where continuously grown grains having a length Z1 are formed. Actually, the length Z1 of laterally grown grains according to the present invention is determined by a distance between the adjacent middles lines 124. Namely, by way of adjusting the distance of the first and second light-transmitting portions L and M of the mask 100, the present invention can control the grain size. Additionally, by way of adjusting the width U of rectangular patterns, the manufacturing process ratio can be controlled.

As shown in FIG. 9F, the laterally growing grains border on each other while the crystallization process proceeds in a transverse direction (X-axial direction). The grain growth regions formed by the adjacent first and second light-transmitting portions of the mask meet and form a boundary. Therefore, the lateral grain growth stops at the boundary of adjacent crystallized regions.

In FIGS. 9E and 9F, as crystallization continues in the transverse direction using the mask of FIG. 8, larger grains are formed. When the mask 100 has two light-transmitting portions L and one light-transmitting portion M, the amorphous silicon film 122 deposited on the substrate 120 is crystallized into crystalline silicon having a width Z. Together the first and second light-transmitting portions L and M of FIG. 8 creates a grain having a length Z1 as shown in FIGS. 9E and 9F.

After completing crystallization in the transverse direction, the X-Y stage or the mask moves in a longitudinal direction (Y-axial direction) by a distance of several millimeters for another X-axial directional crystallization. That is, the mask is repositioned for another transverse pass. Then, the amorphous silicon film is transversely crystallized. After all Y-axial movements and X-axial crystallizations are done the silicon film is fully crystallized. Furthermore, crystallization is relatively quick. Since the mask 100 has tier-shaped echelon formations, and since the X-Y stage or the mask moves by several hundred micrometers to several millimeters for subsequent crystallizations, the crystallization is completed much faster than in the conventional art.

The crystalline silicon layer formed by the present invention, as described above, can be used an active layer of a thin film transistor, among other uses, such as driving devices and switching devices.

When the resolution of a liquid crystal display device become greater, the pad pitch of the signal lines and scanning lines is reduced. Thus, it becomes more difficult to bond a TCP (Tape Carrier Package) to the pads. However, SLS grown polycrystalline silicon can be used for driving ICs (Integrated Circuits) and can be formed on the same substrate as the thin film transistors. Such formation of driving ICs on a substrate decreases production costs and can ease fabrication difficulties.

Figure 10:
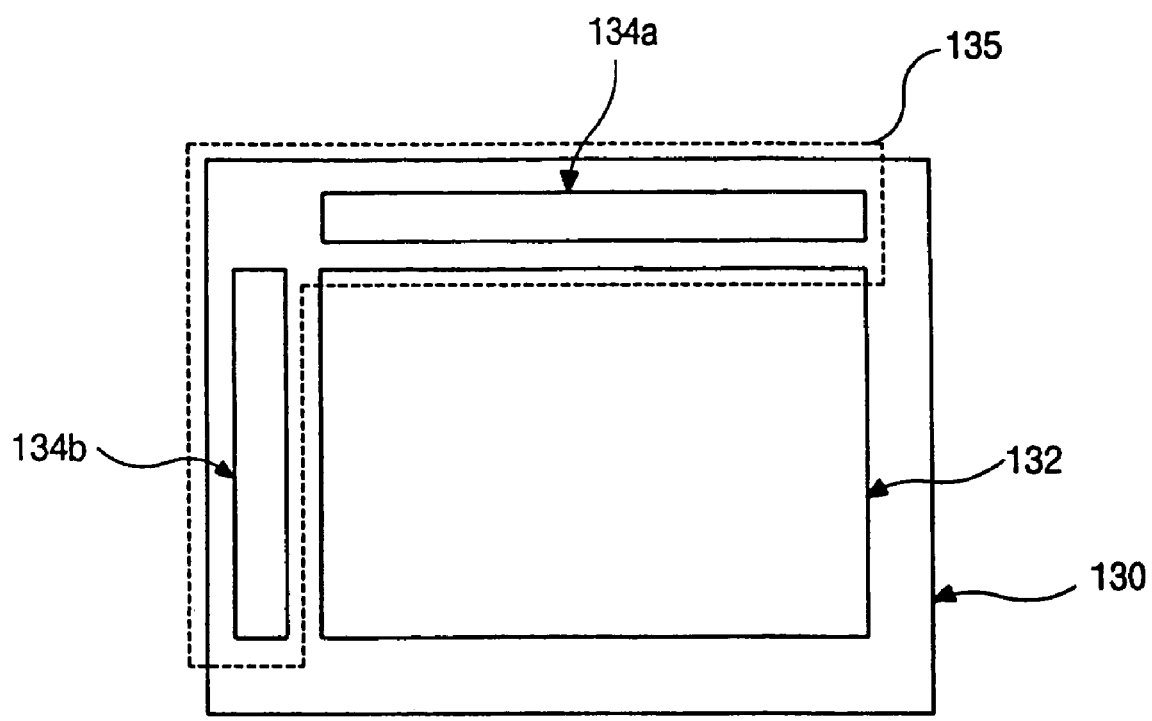
FIG. 10 is a schematic view of a liquid crystal display panel, including a data driving circuit and a gate driving circuit, having active layers crystallized according to the principles of the present invention.

FIG. 10 is a schematic view of a liquid crystal display panel that includes a data driving circuit 134a and a gate driving circuit 134b that use crystalline active layers fabricated according to the present invention.

As shown in FIG. 10, a liquid crystal panel 130 includes a display region 132 and a driving region 135. In the display region 132 are a plurality of switching devices, i.e., thin film transistors (TFTs). The data driving circuit 134a and the gate driving circuit 134b are also disposed in the driving region 135. Those driving circuits 134a and 134b include a plurality of CMOS (Complementary Metal Oxide Semiconductor) devices.

Figure 11:
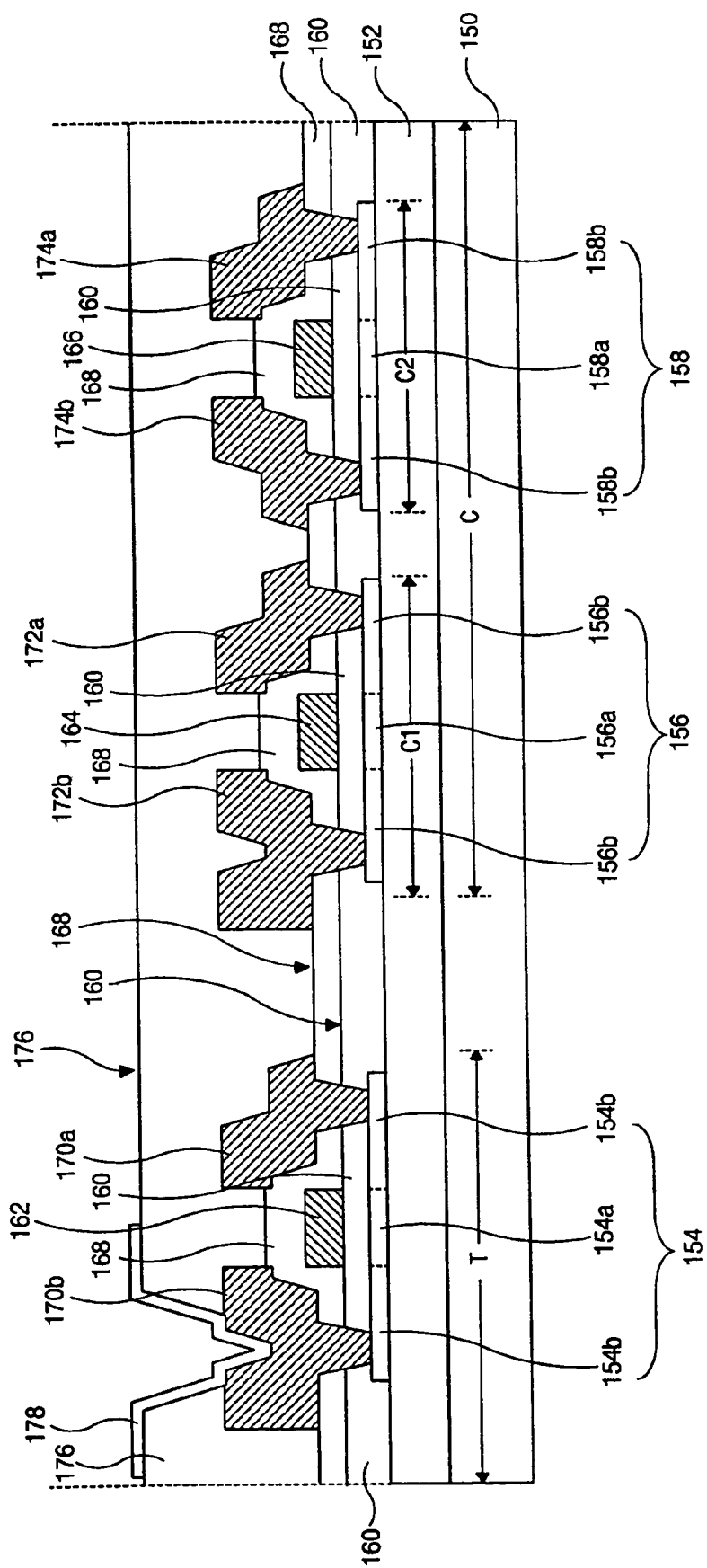
FIG. 11 is a plan view showing a switching device and CMOS transistors with active layers crystallized according to the principles of the present invention.

As shown in FIG. 11, a CMOS device C is comprised of an N-type TFT C1 and a P-type TFT C2, which are driven by an inverter relative to each other in the normal totem pole fashion. Since a CMOS device C consumes little electric power, it is a very suitable driving circuit. Such CMOS devices require fast operating characteristics, characteristics that are meet by active layers comprised of polycrystalline silicon formed by the inventive method. Further, since the TFT T of FIG. 11 is formed of polycrystalline silicon fabricated according to the principles of the present invention, that TFT has high electron mobility, which improves display quality.

The fabrication process for the CMOS device C and the thin film transistor T will be explained as follows. At this time, it is supposed that the thin film transistor T is an N-type.

First, a buffer layer 152 is formed on a transparent substrate 150. An amorphous silicon (a-Si:H) layer that includes hydrogen is formed on the buffer layer 152. That amorphous silicon is then dehydrogenated. Thereafter, the amorphous silicon layer is crystallized using one of the aforementioned methods (first or second embodiments), thereby forming a polycrystalline silicon layer.

The polycrystalline silicon layer is then patterned to form first to third active layers 154, 156 and 158. The first polycrystalline silicon active layer 154 is divided into an active channel region 154a and two doping regions 154b that are disposed on both sides of the active channel region 154a. Furthermore, the second polycrystalline silicon active layer 156 is divided into an active channel region 156a and two doping regions 156b, and the third polycrystalline silicon active layer 158 is divided into an active layer 158a and two doping regions 158b. A first insulation layer 160 is formed on the buffer layer 152 so as to cover the polycrystalline silicon active layers 154, 156 and 158. Gate electrodes 162, 164 and 166 are then formed on the first insulation layer 160, particularly over the active channel regions 154a, 156a and 158a.

Thereafter, the doping regions 154b, 156b and 158b are doped while using the gate electrodes 162, 164 and 166 as masks. The doping regions 154b and 156b are doped by $n^+$ ions, whereas the doping regions 158b are doped by $p^+$ ions. Therefore, the transistors T and C1 become N-type transistors and the transistor C2 becomes a P-type transistor.

Thereafter, a second insulation layer 168 is formed on the first insulation layer 160 to cover the gate electrodes 162, 164 and 166. The first and second insulation layers 160 and 168 are then patterned to form contact holes that expose impurity-doped regions 154b, 156b and 158b. After patterning the first and second insulation layers 160 and 168, a metal layer is formed on the second insulation layer 168. That metal layer is then patterned to form source electrodes 170a, 172a and 174a and drain electrodes 170b, 172b and 174b. As shown in FIG. 11, the source electrodes 170a, 172a and 174a contact the impurity-doped regions 154b, 156b and 158b, respectively, on the right side of the transistors. The drain electrodes 170b, 172b and 174b also contact the impurity-doped regions 154b, 156b and 158b, respectively, on the left side of the transistors. Therefore, the thin film transistor T and the CMOS device C are formed. A passivation layer 176 is then formed on the second insulation layer 168 to cover all transistors T, C1 and C2. The passivation layer 176 is then patterned to expose a portion of the drain electrode 170b of the thin film transistor T. Thus, a pixel electrode 178 formed on the passivation layer 176 contacts the drain electrode 170b of the thin film transistor T.

The switching devices and operating devices shown in FIG. 11 is fabricated using the polycrystalline silicon that is crystallized by the first and second embodiment of the present invention, so that the process time can be substantially shortened and the manufacturing yield increases.

According to the SLS method of the present invention, since the mask has a tier-shaped light-transmitting portion having an echelon formation, the crystallization time and the fabricating process time are dramatically reduced over prior art methods when crystallizing the amorphous silicon film. Further, it is possible to control the grain size.

It will be apparent to those skilled in the art that various modifications and variations can be made in the method of crystallizing the amorphous silicon without departing from the spirit or scope of the inventions. Thus, it is intended that the present invention cover the modifications and variations of this invention provided they come within the scope of the appended claims and their equivalents.

What is claimed is:

1. A method of crystallizing an amorphous silicon film, comprising;
    forming an amorphous silicon film on a substrate;
    irradiating the amorphous silicon film using a laser beam that passes through a mask such that laterally grown grains are formed;
    transversely moving the mask relative to the substrate; and
    performing a second crystallization such that laterally grown grains adjacent to the crystallized silicon particle regions continue to grow;
    wherein the mask includes a light absorptive portion for blocking the laser beam, a plurality of first light-transmitting tiered portions, wherein the tiered portion includes a plurality of tiers adjacent to one another with successively smaller lengths, and a second light-transmitting tiered portion, wherein the tiered portion includes a plurality of tiers adjacent to one another with successively smaller lengths, and wherein the first and second light-transmitting tiered portions pass the laser beam, wherein the second light-transmitting portion is located between the first light-transmitting portions, and wherein each tier has a fixed width;
    wherein the mask is transversely moved relative to the substrate by the width of each tier; and
    wherein the laser beam that passes through the mask melts the amorphous silicon film into liquid silicon, wherein a plurality of grain growth regions, comprised of laterally grown grains and crystallized silicon particles, are formed from solidifying liquid silicon, and wherein the laterally grown grains are formed by growing laterally from an interface between liquid silicon and solid silicon.

2. The method of claim 1, wherein the second light-transmitting tiered portion has fewer tiers than the first light-transmitting portion.

3. The method of claim 1, wherein the mask is transversely moved relative to the substrate a plurality of times to expose the crystallized silicon particle region that was previously formed such that the laterally grown grains grow in the longitudinal direction.

4. The method of claim 3, wherein the mask is moved relative to the substrate in the longitudinal direction after the amorphous silicon film is crystallized in the transverse direction, wherein the mask is subsequently moved relative to the substrate in the transverse direction, and wherein a second transverse direction crystallization is performed.

5. The method of claim 4, wherein the length of the shortest tier in each light-transmitting tiered portion is less than or equal to twice the maximum length of lateral grain growth.

6. The method of claim 5, wherein the lengths of the tiers are in accord with the equation, $XN=[X(N-1)+GN]$, where N is a natural number that is greater than one (N>1), XN is the length of the Nth tier, and GN is a length of lateral grain growth in the Nth rectangular patterns.

7. The method of claim 5, wherein the lengths of the tiers are in accord with the inequality, $XN \leq [X(N-1)+2GN]$, where N is a natural number that is greater than one (N>1), XN is the length of the Nth tier, and GN is a length of lateral grain growth in the Nth rectangular patterns.

8. The method of claim 6, wherein GN is about 2 micrometers.

9. The method of claim 5, wherein the length of the shortest tier is about 2 micrometers.

10. The method of claim 5, wherein the tier widths are substantially equal.

11. The method of claim 10, wherein the tier widths are less than or equal to the maximum length of lateral growth of the grain.

12. The method of claim 1, wherein the fixed width is between 100 micrometers and 10 millimeters.

13. The method of claim 1, wherein the crystallized silicon particle regions include polysilicon particles.

14. The method of claim 1, wherein the mask moves by a distance ranging from 100 micrometers to 10 millimeters.

15. The method of claim 1, wherein the first light transmitting tier portions are separated by a distance that is less than the maximum tier length of the second light-transmitting tier portion.

* * * * *